(12) United States Patent
Livingston et al.

(10) Patent No.: US 6,185,173 B1
(45) Date of Patent: Feb. 6, 2001

(54) SAMPLED AMPLITUDE READ CHANNEL EMPLOYING A TRELLIS SEQUENCE DETECTOR MATCHED TO A CHANNEL CODE CONSTRAINT AND A POST PROCESSOR FOR CORRECTING ERRORS IN THE DETECTED BINARY SEQUENCE USING THE SIGNAL SAMPLES AND AN ERROR SYNDROME

(75) Inventors: Jay N. Livingston, Lafayette; William G. Bliss, Thornton, both of CO (US)

(73) Assignee: Cirrus Logic, Inc., Austin, TX (US)

( * ) Notice: Under 35 U.S.C. 154(b), the term of this patent shall be extended for 0 days.

(21) Appl. No.: 09/127,101

(22) Filed: Jul. 31, 1998

(51) Int. Cl.$^7$ ...................................................... G11B 7/00

(52) U.S. Cl. ............................................. 369/59; 360/53

(58) Field of Search ............................... 360/51, 53, 65, 360/46; 369/59, 48, 47

(56) References Cited

U.S. PATENT DOCUMENTS

| | | |
|---|---|---|
| 5,257,272 | 10/1993 | Fredrickson . |
| 5,280,489 | 1/1994 | Fredrickson et al. ................... 371/45 |
| 5,521,945 | 5/1996 | Knudson . |
| 5,548,600 | 8/1996 | Fredrickson et al. . |
| 5,617,573 | 4/1997 | Huang et al. . |
| 5,771,127 | 6/1998 | Reed et al. . |
| 5,774,286 | 6/1998 | Shimoda . |
| 5,774,470 | 6/1998 | Nishiya et al. . |
| 5,801,649 | 9/1998 | Fredrickson ........................... 341/58 |
| 5,809,080 | 9/1998 | Karabed et al. ...................... 375/263 |
| 5,844,741 | 12/1998 | Yamakawa et al. ................... 360/65 |
| 5,859,601 | 1/1999 | Moon et al. ........................... 341/59 |
| 5,938,790 | 8/1999 | Marrow ................................. 714/795 |
| 5,949,357 | 9/1999 | Fitzpatrick et al. .................... 341/68 |
| 5,949,831 | 9/1999 | Coker et al. .......................... 375/341 |
| 6,023,386 | * 2/2000 | Reed et al. ............................. 360/53 |
| 6,032,284 | * 2/2000 | Bliss ...................................... 360/51 |

OTHER PUBLICATIONS

U.S. Patent Application Ser. No. 08/862,493, to Reed et al., filed May 23, 1997.

Bahl et al, "Optimal Decoding of Linear Codes for Minimizing Symbol Error Rate", *IEEE Trans. on Information Theory*, Mar., 1974.

U.S. Patent Application Ser. No. 08/815,881, to Bliss, filed Mar. 12, 1997.

Bliss, "An 8/9 Rate Time–Varying Trellis Code for High Density Magnetic Recording", *IEEE Trans. on Magnetics*, Sep. 1997.

(List continued on next page.)

*Primary Examiner*—Nabil Hindi
(74) *Attorney, Agent, or Firm*—Howard H. Sheerin; Dan A. Shifrin; J. P. Violette

(57) ABSTRACT

A sampled amplitude read channel is disclosed for disk storage systems comprising a encoder/decoder for implementing a high rate channel code that codes out specific minimum distance error events of a trellis sequence detector by enforcing a particular code constraint. The trellis sequence detector comprises a state machine matched to the code constraint which effectively removes the corresponding minimum distance errors from the detected output sequence. Additionally, the channel code encodes redundancy bits into the write data for implementing an error detection code. The redundancy bits are processed during a read operation to generate an error syndrome used to detect and correct other dominant error events, such as the NRZ (+) and (+–+) error events. In this manner, the most likely error events of the trellis sequence detector are either coded out by the channel code constraint, or detected and corrected using the error syndrome. As a result, the present invention provides a significant distance enhancing performance gain over the prior art without decreasing the system's code rate, thereby providing a substantial increase in linear bit density and overall storage capacity.

28 Claims, 18 Drawing Sheets

OTHER PUBLICATIONS

Fitzpatrick et al, "Time varying MTR Codes for High Density Magnetic Recording", *Proceedings Globecom '97*, Nov. 1997, Phoenix, AZ.

McEwen, Wolf, "Trellis Codes for (1,k) E²PR4ML with Squared Distance 18", *IEEE Transactions on Magnetics*, vol. 32. No. 5, Sep. 1996.

Brian H. Marcus, "Finite–State Modulation Codes for Data Storage", *IEEE Journal on Selected Areas in Communications*, vol. 10, No. 1, Jan. 1992.

Takushi Nishiya, "PERD: Partial Error Response Detection," *IEEE Inter Mag '95*, San Antonio, Texas, Apr. 1995.

Takushi Nishiya and Hideyuki Yamakawa, "PERD: Partial Error Response Detection," *IEEE Transactions on Magnetics*, vol. 31, No. 6, Nov. 1995.

Roger Wood, "Turbo–PRML: A Compromise EPRML Detector," *IEEE Transactions on Magnetics*, vol. 29, No. 6, Nov. 1993.

Hideyuki Yamakawa, "SPERD: Simplified Partial Error Response Detection," *IEEE Inter Mag '95*, San Antonio, Texas, Apr. 1995.

T. Conway & J. Nelson: "A New Coding Method to Increase SNR on the Magnetic Recording Channel"; Communications: The Key to Global Prosperity, GLOBECOM 1996, IEEE, Nov. 18–22, 1996; pp. 363–367, XP000742181.

J. Hagenauer and P. Hoeher, "A Viterbi Algorithm with Soft–Decision Outputs and its Applications", Conference Proceedings, IEEE Globecom, Dallas, TX, Nov., 1989.

* cited by examiner

NRZ

PR 4

EPR 4

EEPR 4

EVEN PARITY CODEBOOKS

ODD PARITY CODEBOOKS

SAMPLED AMPLITUDE READ CHANNEL EMPLOYING A TRELLIS SEQUENCE DETECTOR MATCHED TO A CHANNEL CODE CONSTRAINT AND A POST PROCESSOR FOR CORRECTING ERRORS IN THE DETECTED BINARY SEQUENCE USING THE SIGNAL SAMPLES AND AN ERROR SYNDROME

CROSS REFERENCE TO RELATED APPLICATIONS AND PATENTS

This application is related to several U.S. Patents, namely U.S. Pat. Nos. 5,926,490 entitled "SAMPLED AMPLITUDE READ CHANNEL EMPLOYING A REMOD/DEMOD SEQUENCE DETECTOR GUIDED BY AN ERROR SYNDROME," 6,050,248 entitled "A PARITY CHANNEL CODE FOR ENHANCING THE OPERATION OF A REMOD/DEMOD SEQUENCE DETECTOR IN A D=1 SAMPLED AMPLITUDE READ CHANNEL" and 6,032,284 entitled "TRELLIS CODING SYSTEM WHICH CONSTRAINS THE OCCURRENCE OF TRIBITS TO K-MODULO-THREE." This application is also related to U.S. patents, namely U.S. Pat. Nos. 5,291,499 entitled "METHOD AND APPARATUS FOR REDUCED-COMPLEXITY VITERBI-TYPE SEQUENCE DETECTORS," 5,696,639 entitled "SAMPLED AMPLITUDE READ CHANNEL EMPLOYING INTERPOLATED TIMING RECOVERY," 5,424,881 entitled "SYNCHRONOUS READ CHANNEL," and 5,585,975, "EQUALIZATION FOR SAMPLE VALUE ESTIMATION AND SEQUENCE DETECTION IN A SAMPLED AMPLITUDE READ CHANNEL." All of the above-named patents are assigned to the same entity, and all are incorporated herein by reference.

FIELD OF INVENTION

The present invention relates to the recording and reproduction of binary data in storage systems for digital computers (such as magnetic and optical disk drives), particularly to a sampled amplitude read channel employing a trellis sequence detector matched to a code constraint for detecting a binary sequence during a read operation, and a post processor for correcting errors in the detected binary sequence using samples of the read signal and an error syndrome generated from redundancy bits encoded into the recorded data.

BACKGROUND OF THE INVENTION

In computer storage devices, such as optical and magnetic disk drives, sampled amplitude read channels employing partial response (PR) signaling with maximum likelihood (ML) sequence detection have provided a substantial increase in storage capacity by allowing for significantly higher linear bit densities. Partial response signaling refers to a particular method for transmitting symbols represented as analog pulses through a communication medium. The benefit is that at the signaling instances (baud rate) there is no intersymbol interference (ISI) from other pulses except for a controlled amount from immediately adjacent, overlapping pulses. Allowing the pulses to overlap in a controlled manner leads to an increase in the symbol rate (linear recording density) without sacrificing performance in terms of signal-to-noise ratio (SNR).

Partial response channels are characterized by the polynomials $$(1-D)(1+D)^n$$

where D represents a delay of one symbol period and n is an integer. For n=1,2,3, the partial response channels are referred to as PR4, EPR4 and EEPR4, with their respective frequency responses shown in FIG. 1A. The channel's dipulse response, the response to an isolated symbol, characterizes the transfer function of the system (the output for a given input). With a binary "1" bit modulating a positive dipulse response and a binary "0" bit modulating a negative dipulse response, the output of the channel is a linear combination of time shifted dipulse responses. The dipulse response for a PR4 channel $(1-D^2)$ is shown as a solid line in FIG. 1B. Notice that at the symbol instances (baud rate), the dipulse response is zero except at times t=0 and t=2. Thus, the linear combination of time shifted PR4 dipulse responses will result in zero ISI at the symbol instances except where immediately adjacent pulses overlap.

It should be apparent that the linear combination of time shifted PR4 dipulse responses will result in a channel output of +2, 0, or −2 at the symbol instances depending on the binary input sequence. The output of the channel can therefore be characterized as a state machine driven by the binary input sequence, and conversely, the input sequence can be estimated or demodulated by running the signal samples at the output of the channel through an "inverse" state machine. Because noise will obfuscate the signal samples, the inverse state machine is actually implemented as a trellis sequence detector which computes a most likely input sequence associated with the signal samples.

Operation of a PR4 trellis sequence detector is understood from its state transition diagram shown in FIG. 2A. Each state 100 is represented by the last two input symbols (in NRZ after precoding), and each branch from one state to another is labeled with the current input symbol in NRZ 102 and the corresponding sample value 104 it will produce during readback. The demodulation process of the PR4 sequence detector is understood by representing the state transition diagram of FIG. 2A as a trellis diagram shown in FIG. 2B. The trellis diagram represents a time sequence of sample values and the possible recorded input sequences that could have produced the sample sequence. For each possible input sequence, an error metric is computed relative to a difference between the sequence of expected sample values that would have been generated in a noiseless system and the actual sample values output by the channel. For instance, a Euclidean metric is computed as the accumulated square difference between the expected and actual sample values. The input sequence that generates the smallest Euclidean metric is the most likely sequence to have created the actual sample values; this sequence is therefore selected as the output of the sequence detector.

To facilitate the demodulation process, the sequence detector comprises path memories for storing each of the possible input sequences and a corresponding metric. A well known property of the sequence detector is that the paths storing the possible input sequences will "merge" into a most likely input sequence after a certain number of sample values are processed, as long as the input sequence is appropriately constrained. In fact, the maximum number of path memories needed equals the number of states in the trellis diagram; the most likely input sequence will always be represented by one of these paths, and these paths will eventually merge into one path (i.e., the most likely input sequence) after a certain number of sample values are processed.

The "merging" of path memories is understood from the trellis diagram of FIG. 2B where the "survivor" sequences are represented as solid lines. Notice that each state in the trellis diagram can be reached from one of two states; that is, there are two transition branches leading to each state. With each new sample value, the Viterbi algorithm recursively computes a new error metric and retains a single survivor sequence for each state corresponding to the minimum error metric. In other words, the Viterbi algorithm will select one of the two input branches into each state since only one of the branches will correspond to the minimum error metric, and the paths through the trellis corresponding to the branches not selected will merge into the paths that were selected. Eventually, all of the survivor sequences will merge into one path through the trellis which represents the most likely estimated data sequence to have generated the sample values as shown in FIG. 2B.

In some cases, if the input sequence is not appropriately constrained through the use of a channel code, the path memories will not merge into one survivor sequence. Consider the PR4 trellis shown in FIG. 2B; an input sequence of all zeros or all ones will prevent the paths from merging which leads to multiple possible survivor sequences output by the detector. Data sequences which prevent the path memories from merging are referred to as "quasi-catastrophic" data sequences since they result in quasi-catastrophic errors in the output sequence. In order to avoid quasi-catastrophic errors, a channel code is typically employed which codes out of the recorded data all sequences which can prevent the path memories from merging.

Even if the quasi-catastrophic data sequences are coded out of the input sequence, the sequence detector can still make an error in detecting the output sequence if enough destructive noise is present in the read signal. The possible output sequences are different from one another by a minimum Euclidean distance; a detection error typically occurs when the signal noise breaches this minimum distance between valid output sequences. FIGS. 3A–3D illustrate the sample error sequences associated with the dominant minimum distance error events of a PR4 sequence detector in NRZ, PR4, EPR4 and EEPR4 space, respectfully. In general, a higher order sequence detector will outperform a lower order sequence detector due to the number of data samples the error event affects. Consider, for example, the first error event in the NRZ space shown in FIG. 3A. This error event generates two noise samples which corrupt two data samples (two output bits) in the PR4 space of FIG. 3B, four noise samples in the EPR4 space of FIG. 3C, and four noise samples with two having increased magnitude in the EEPR4 space of FIG. 3D. This "spreading out" of the error event reduces the probability of a detection error.

A minimum distance error event can occur where the data sequences diverge from a particular state in the trellis and then remerge at a later state. In a perfect system, all of the minimum distance error events will occur with equal probability. However, because the channel equalizers correlate the noise in the signal samples, the minimum length, minimum distance error events are more likely to occur. Thus, the error events shown in FIGS. 3A–D are the "dominant" minimum distance error events because they are shortest in length. The first error event ((+) in NRZ), which is the shortest error event, is typically the most dominant; however, depending on the partial response polynomial employed, other error events may become the most dominant as the linear bit density increases.

An increase in performance can be achieved by employing a channel code to code out data sequences associated with the minimum distance error events (similar to coding out the quasi-catastrophic data sequences), and then to match the sequence detector to this channel code using conventional trellis coded modulation (TCM) techniques. For example, the minimum distance error events shown in FIG. 3A can be coded out by removing the bit sequences consisting of (1,0,1) or (0,1,0) from the input sequence. The state machine of a PR4 sequence detector can then be matched to this code constraint by removing the inner branches shown in FIG. 2A. With these branches removed, the minimum distance of the PR4 sequence detector increases from $dmin^2=2$ to $dmin^2=4$ (with the signal samples normalized to +1, 0, −1).

The recording and reproduction of digital data through a disk storage medium can be modeled as a communication channel. Partial response signaling is particularly well suited to disk storage systems because they are bandpass channels in nature and therefore less equalization is required to match the overall response to a desired partial response polynomial. Referring to FIG. 1A, higher order partial response polynomials, such as EEPR4, are more closely matched to the channel's natural response than lower order polynomials, particularly at higher linear densities. Thus, in addition to spreading out the error samples as shown in FIG. 3, higher order partial response channels typically provide better performance since less equalization is required to match the channel's response to the desired partial response. However, the trade-off in performance is the cost of complexity; the number of states in the state machine increases by $2^{n+1}$ which means an exponential increase in complexity. A full EEPR4 state machine comprises sixteen states ($n=3$) compared to only four states in a PR4 state machine.

Similar to the PR4 read channel described above, matching the EEPR4 state machine to a run-length limited (RLL) $d=1$ constraint (which prevents consecutive NRZI "1" bits) codes out the minimum distance error events of an EEPR4 sequence detector, effectively increasing the minimum distance between valid output sequences from $dmin^2=6$ to $dmin^2=10$. However, a disadvantage to the RLL $d=1$ constraint is the attendant decrease in code rate, the ratio of user data bits to codeword bits which is typically 2/3 in an RLL (1,7) system. The decrease in code rate is undesirable because it decreases the user data density and hence the overall storage capacity of the disk. The user data density and storage capacity can be increased by increasing the channel data density, but this increases the bit error rate due to the effective decrease in SNR. Further, increasing the channel density requires faster read channel circuitry to compensate for the increase in the channel data rate. And even though an RLL $d=1$ constraint codes out the minimum distance error events of an EEPR4 sequence detector, it does not code out the next most dominant error event, a bit-shift caused by the (+) error event.

There is, therefore, a need for an improved sampled amplitude read channel for use in disk storage systems that provides a distance enhancing performance gain without decreasing the storage system's code rate. In particular, it is an object of the present invention to enhance the operation of a trellis sequence detector by attenuating certain minimum distance error events, including the bit-shift error event, using a high rate, cost effective channel code.

SUMMARY OF THE INVENTION

A sampled amplitude read channel is disclosed for disk storage systems comprising a encoder/decoder for implementing a high rate channel code that codes out specific minimum distance error events of a trellis sequence detector by enforcing a particular code constraint. The trellis sequence detector comprises a state machine matched to the code constraint which effectively removes the corresponding minimum distance errors from the detected output sequence. Additionally, the channel code encodes redundancy bits into the write data for implementing an error detection code. The redundancy bits are processed during a read operation to generate an error syndrome used to detect and correct other dominant error events, such as the NRZ (+) and (+−+) error events. In this manner, the most likely error events of the trellis sequence detector are either coded out by the channel code constraint, or detected and corrected using the error syndrome. As a result, the present invention provides a significant distance enhancing performance gain over the prior art without decreasing the system's code rate, thereby providing a substantial increase in linear bit density and overall storage capacity.

In one embodiment, the channel code of the present invention codes out sequences of five or more consecutive NRZI "1" bits and sequences of four consecutive NRZI "1" bits (or quadbits) from one of the even or odd interleaves of the write data. This code, referred to as a quadbit-modulo-two or QM2 code, can be implemented cost effectively with a code rate of 17/18, which is significantly higher than the code rate of 2/3 for the conventional RLL d=1 channel code. To match the sequence detector's state machine to the QM2 code constraint, the branches which correspond to four consecutive NRZI "1" bits are removed at every other sample interval. Such a state machine is deemed "time varying" since its structure varies over time.

The QM2 code constraint codes out the corresponding minimum distance error events of length four and longer; a simple parity error detection code is then used to correct the shorter minimum distance error event (+−+) as well as the dominant (+) error event. Combining the QM2 code with a parity code provides a significant increase in the system's effective signal-to-noise ratio (SNR); it approaches the performance of a trellis sequence detector matched to both code constraints, but with a significant reduction in circuitry cost and complexity. Furthermore, the QM2-Parity code of the present invention can be implemented cost effectively with a high code rate of 48/52 relative to the 2/3 code rate of the conventional RLL d=1 code, thereby increasing the system's storage capacity without increasing the channel data rate.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Data Format

Figure 4A:
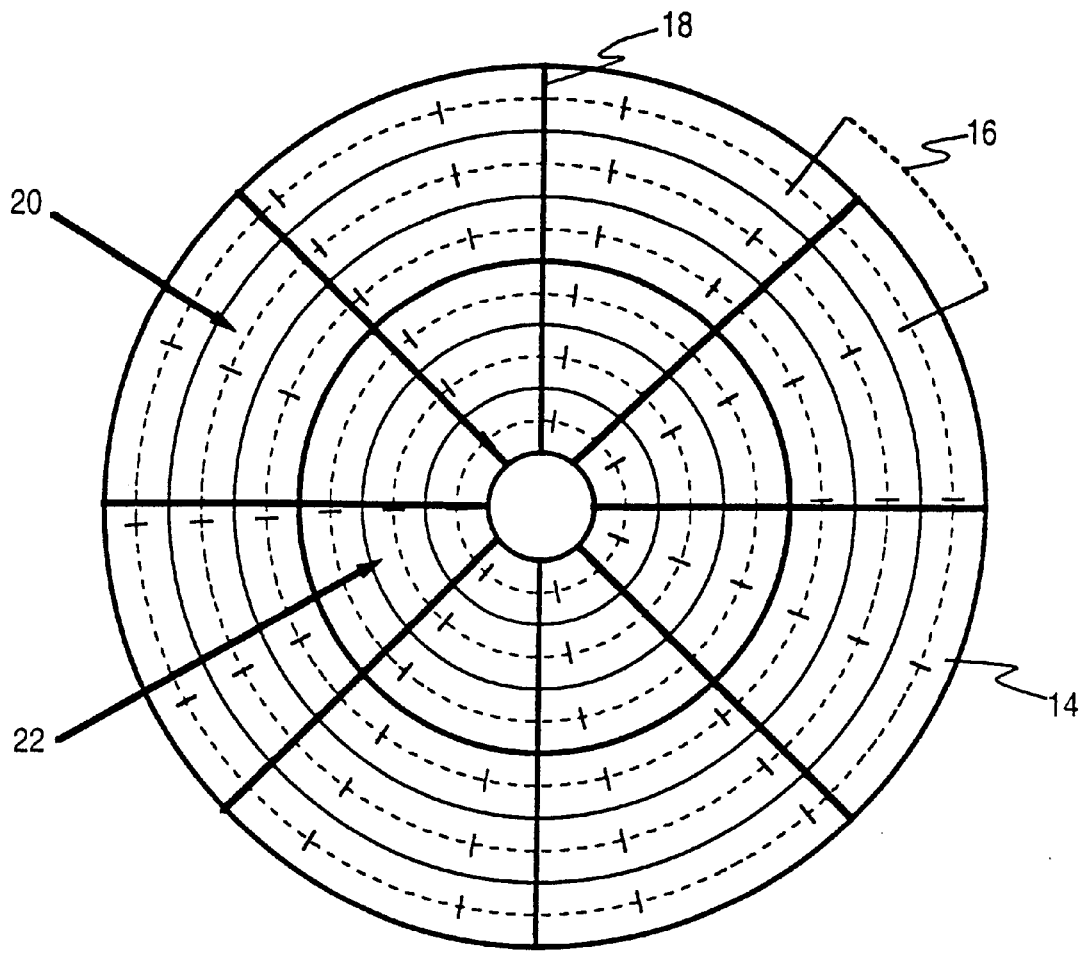
FIG. 4A shows a typical data format for a magnetic disk storage medium, comprising a plurality of concentric data tracks grouped in predefined zones, where each data track is partitioned into a number of data sectors.

FIG. 4A shows a conventional data format of a magnetic disk storage medium comprising a series of concentric, radially spaced data tracks 14, wherein each data track 14 comprises a plurality of sectors 16 with embedded servo wedges 18. A servo controller (not shown) processes the servo data in the servo wedges 18 and, in response, positions a read/write head over a selected track. Additionally, the servo controller processes servo bursts within the servo wedges 18 to keep the head aligned over a centerline of the selected track while writing and reading data. The servo wedges 18 may be detected by a simple discrete-time pulse detector or by a discrete-time sequence detector. The format of the servo wedges 18 includes a preamble and a sync mark, similar to the user data sectors 16 described below with reference to FIG. 4B.

Zoned recording is a technique known in the art for increasing the storage density by recording the user data at different rates in predefined zones between the inner diameter and outer diameter tracks. The data rate can be increased at the outer diameter tracks due to the increase in circumferential recording area and the decrease in intersymbol interference. This allows more data to be stored in the outer diameter tracks as is illustrated in FIG. 4A where the disk is partitioned into an outer zone 20 comprising fourteen data sectors per track, and an inner zone 22 comprising seven data sectors per track. In practice, the disk is actually partitioned into several zones with increasing data rates from the inner to outer diameter zones.

Figure 4B:
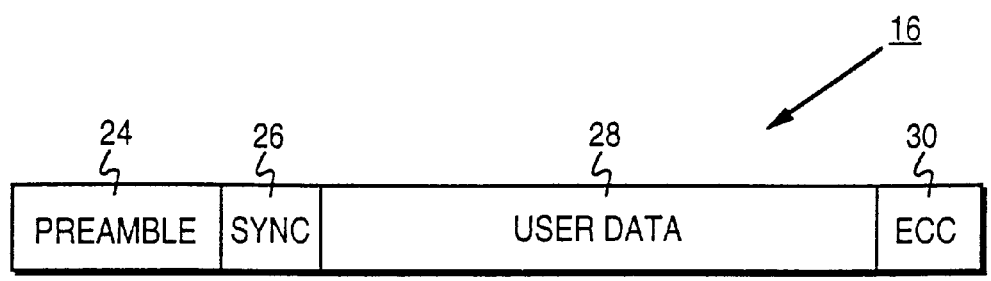
FIG. 4B shows a typical format for a data sector.

FIG. 4B shows the format of a data sector 16 comprised of an acquisition preamble 24, a sync mark 26, a user data field 28, and appended ECC bytes 30 for use in detecting and correcting errors in the user data upon readback. Timing recovery 68 of FIG. 5 processes the acquisition preamble 24 to acquire the correct data frequency and phase before reading the user data field 28, and the sync mark 26 demarks the beginning of the user data field 28 for use in symbol synchronizing the user data. In the present invention, the user data 28 are encoded according to a channel code that provides a distance enhancing improvement over the prior art which is described in greater detail below.

Sampled Amplitude Read Channel

Figure 5:
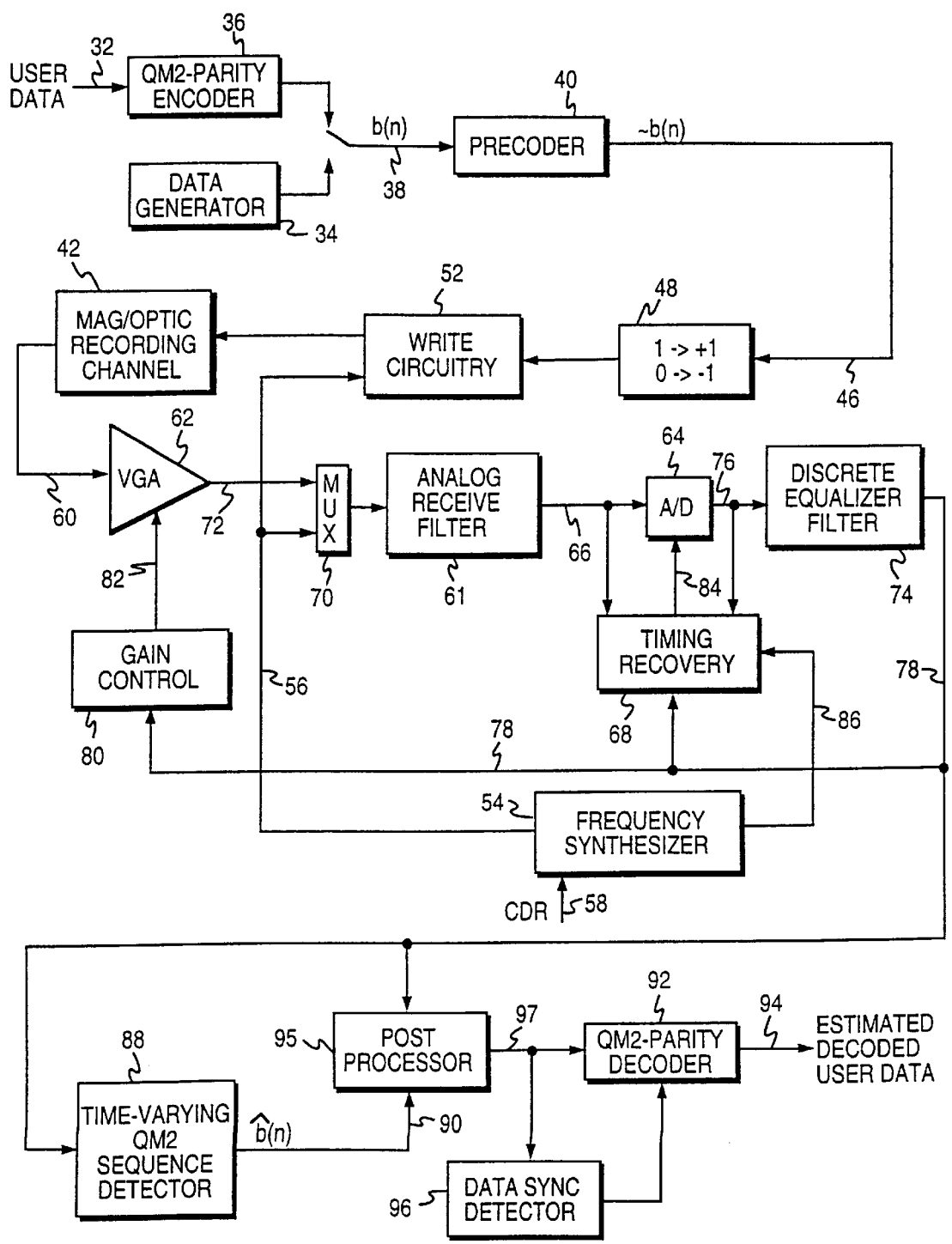
FIG. 5 is a block diagram of the sampled amplitude read channel of the present invention, including an time-varying EEPR4 sequence detector matched to the QM2 code, and a post-processor for correcting minimum distance error events using the error detection code.

Referring now to FIG. 5, shown is a block diagram of the sampled amplitude read channel of the present invention. During a write operation, the read channel receives user data over line 32 from the host system. A data generator 34 generates the preamble 24 of FIG. 4B (for example 2T preamble data) written to the disk prior to writing the user data 28. The data generator 34 also generates a sync mark 26 for use in symbol synchronizing to the user data during a read operation. A QM2-Parity encoder 36 encodes the user data 32 according to a quadbit-mod-two (QM2) and parity constraint to generate an encoded binary sequence b(n) 38.

The QM2 constraint codes out all error events of the form {+−+−}, {+−+−+}, {+−+−+−}, etc., by deleting from the input data all sequences of five or more consecutive transitions (i.e., consecutive NRZI "1" bits) and by allowing sequences of four consecutive transitions (quadbits) to begin only in the even interleave. As explained below, the state transition diagram of the sequence detector 88 is matched to the QM2 constraint which provides a significant distance enhancing performance gain. In addition, a parity constraint is encoded into the write sequence ~b(n) 46 and a post processor 95 generates a parity syndrome used to detect and correct other errors in the estimated binary sequence ^b(n) 90 output by the sequence detector 88, such as the dominant NRZ (+) and (+−+) error events.

After encoding 36 the QM2 and parity constraints, a precoder 40 precodes the binary input sequence b(n) 38 in order to compensate for the transfer function of the recording channel 42 and equalizing filters. The resulting write sequence ~b(n) 46 then modulates 48 the current of the write circuitry 52, thereby modulating the current in the recording head coil (or intensity of a laser beam) at the zone baud rate to record a sequence of transitions onto the disk 42 which represent the recorded data. In NRZ recording, a "1" bit modulates 48 a positive polarity in the write current and a "0" bit modulates 48 a negative polarity. A frequency synthesizer 54 provides a baud rate write clock 56 to the write circuitry 52 and is adjusted by a baud or channel data rate signal (CDR) 58 according to the current zone the recording head is over.

Figure 1A:
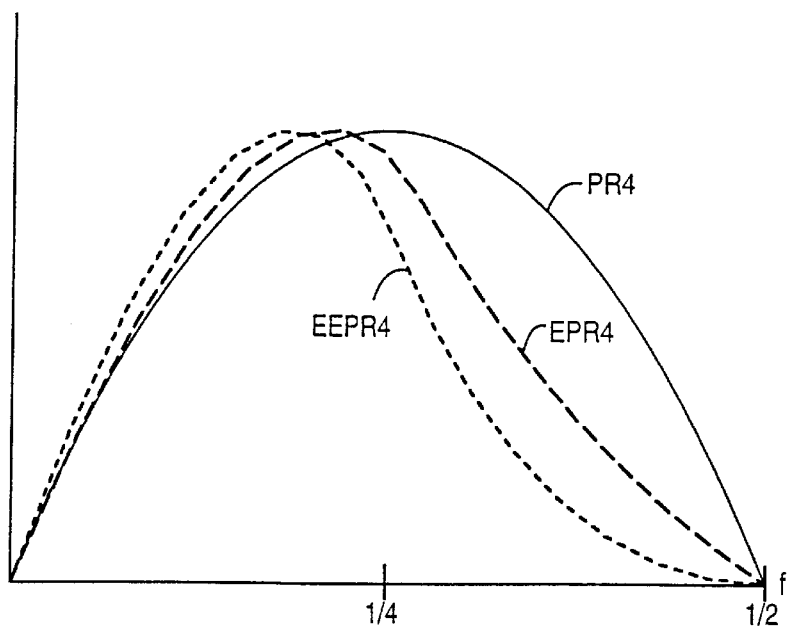
FIG. 1A shows the frequency response for a PR4, EPR4 and EEPR4 read channel.
Figure 1B:
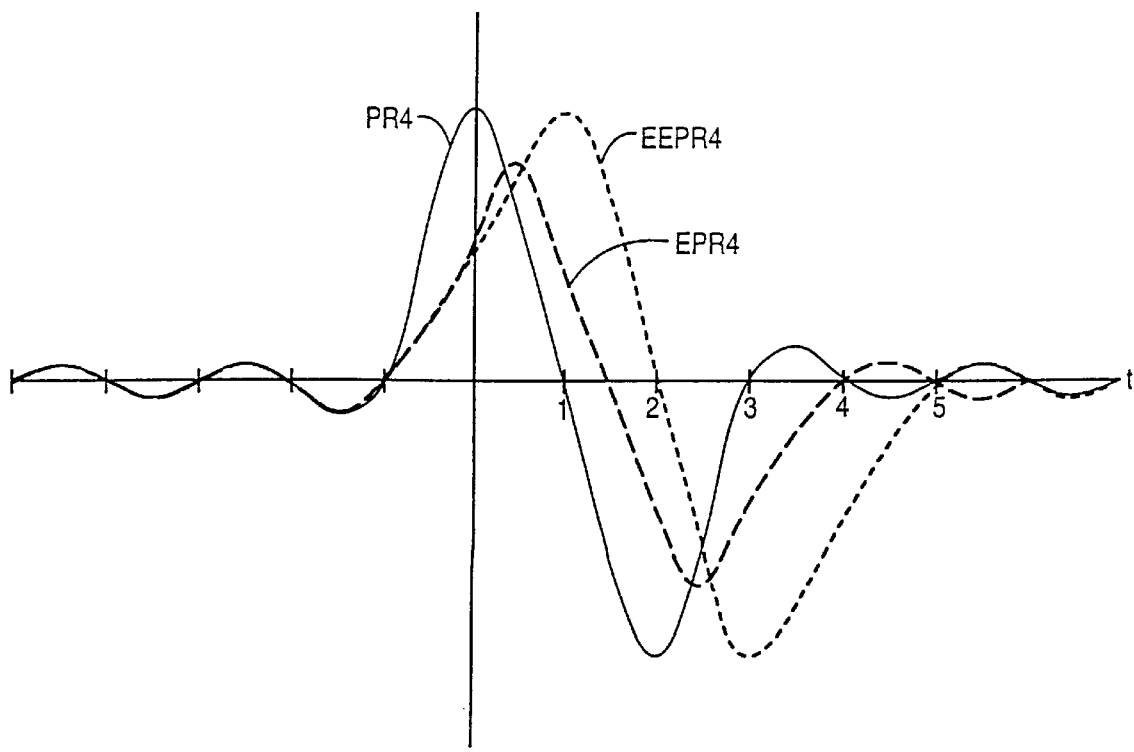
FIG. 1B shows the dipulse responses for the PR4, EPR4 and EEPR4 read channels of FIG. 1A.
Figure 2A:
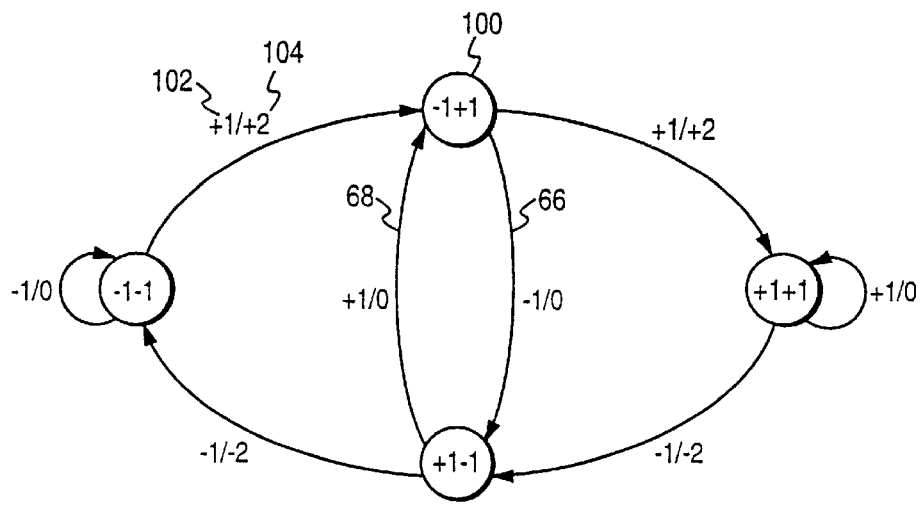
FIG. 2A is a state transition diagram for a PR4 sequence detector.
Figure 2B:
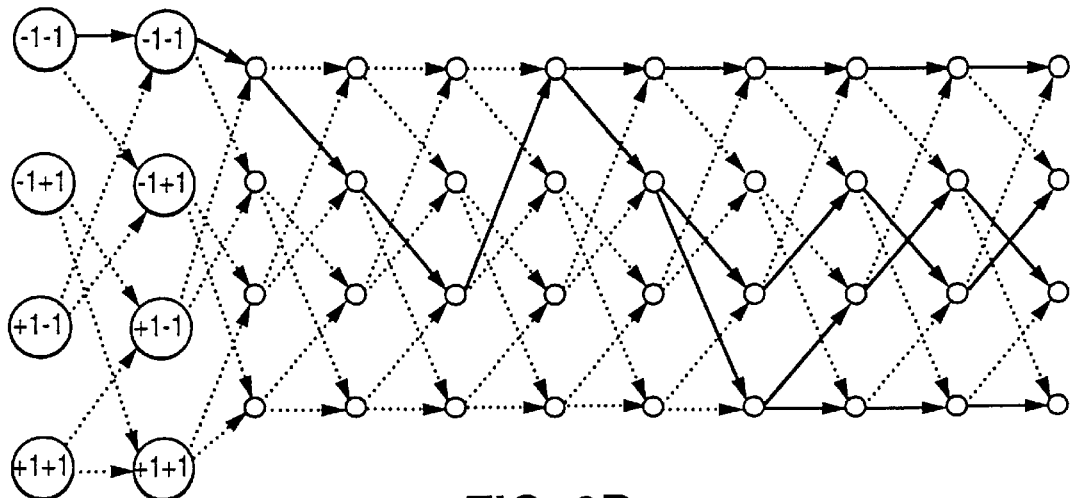
FIG. 2B is a trellis diagram corresponding to the PR4 state transition diagram of FIG. 2A showing the path memory and survivor sequence for a given input sequence.
Figure 3A:
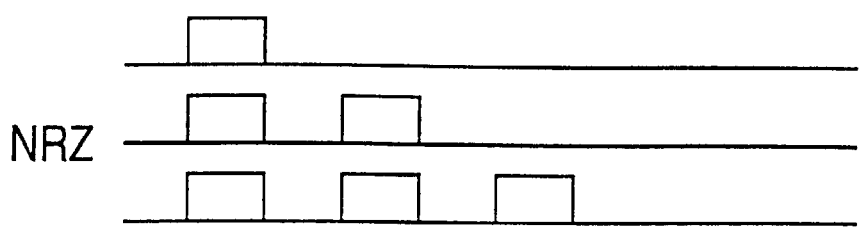
FIGS. 3A–3D show the dominant minimum distance error events of a PR4 sequence detector in NRZ, PR4, EPR4 and EEPR4 space, respectively.
Figure 3B:
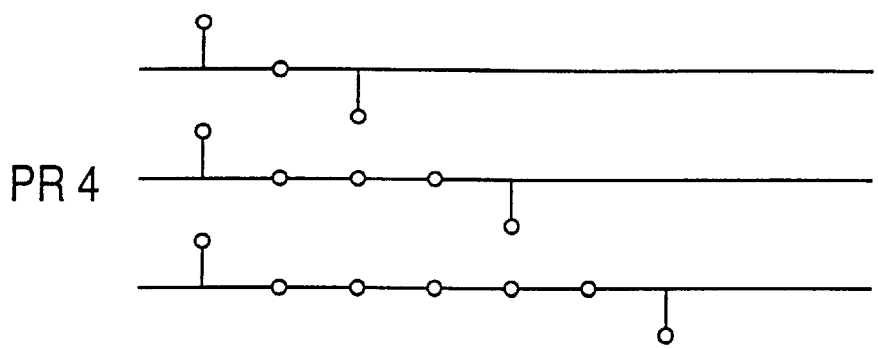
Figure 3C:
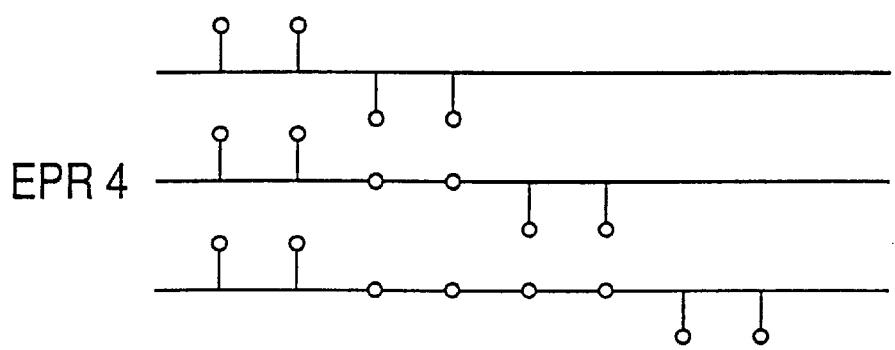
Figure 3D:
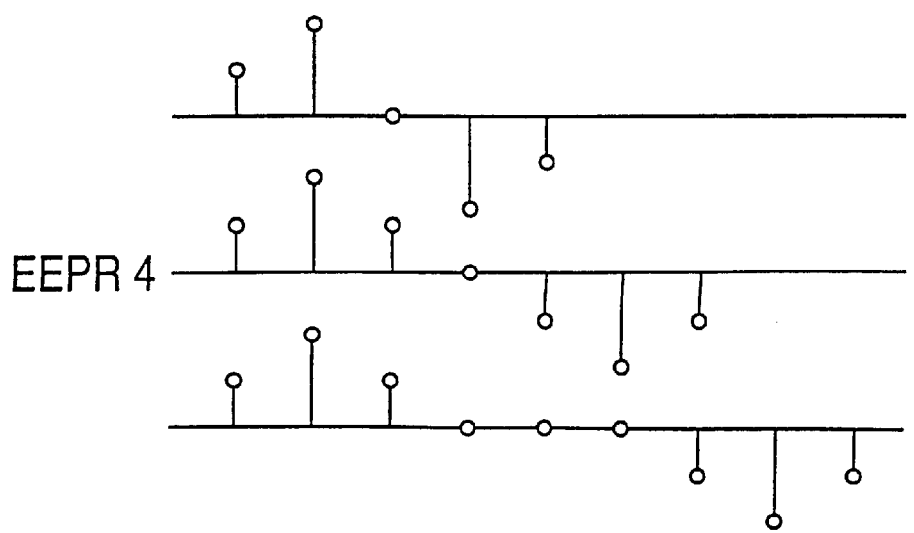

When reading the recorded binary sequence from the media, timing recovery 68 first locks to the write frequency of the zone by selecting, as the input to the read channel, the write clock 56 through a multiplexer 70. Once locked to the write frequency, which is the nominal sampling frequency, the multiplexer 70 selects the signal 72 from the read head as the input to the read channel in order to acquire the acquisition preamble 24 recorded on the disk prior to the recorded user data 28 as shown in FIG. 4B. A variable gain amplifier 62 adjusts the amplitude of the analog read signal 60, and an analog receive filter 61 provides initial equalization toward the desired response as well as attenuating aliasing noise. A sampling device 64 samples the analog read signal 66 from the analog filter 61, and a discrete-time equalizer filter 74 provides further equalization of the sample values 76 toward the desired response. Table 1 shows normalized values for the PR4, EPR4 and EEPR4 dipulse responses of FIG. 1B:

TABLE 1

| Channel | Transfer Function | Dipulse Response |
| --- | --- | --- |
| PR4 | $(1 - D)(1 + D)$ | 0, 1, 0, −1, 0, 0, 0, . . . |
| EPR4 | $(1 - D)(1 + D)^2$ | 0, 1, 1, −1, −1, 0, 0, . . . |
| EEPR4 | $(1 - D)(1 + D)^3$ | 0, 1, 2, 0, −2, −1, 0, . . . |

The discrete equalizer filter 74 may be implemented as a real-time adaptive filter which compensates for parameter variations over the disk radius (i.e., zones), disk angle, and environmental conditions such as temperature drift.

After equalization, the equalized sample values 78 are applied to a decision directed gain control 80 and timing recovery 68 circuit for adjusting the amplitude of the read signal 60 and the frequency and phase of the sampling device 64, respectively. Gain control 80 adjusts the gain of variable gain amplifier 62 over line 82 in order to match the magnitude of the channel's frequency response to the desired partial response, and timing recovery 68 adjusts the frequency of sampling device 64 over line 84 in order to synchronize the equalized samples 78 to the baud rate. Frequency synthesizer 54 provides a course center frequency setting to the timing recovery circuit 68 over line 86 in order to center the timing recovery frequency over temperature, voltage, and process variations.

In the preferred embodiment, the discrete-time equalizer 74 equalizes the 76 sample values into a PR4 response so that a simple slicer circuit (not shown) can generate estimated sample values for use in the timing recovery 68 and gain control 80 decision-directed feedback loops. The PR4 equalized samples 78 are then passed through a $(1+D)^n$ filter to generate sample values in the partial response domain of the sequence detector 88. For implementation details concerning various alternative embodiments for sample value estimation for timing recovery 68 and gain control 80, see the above referenced U.S. Pat. No. 5,585,975, "EQUALIZATION FOR SAMPLE VALUE ESTIMATION AND SEQUENCE DETECTION IN A SAMPLED AMPLITUDE READ CHANNEL."

The synchronous, equalized samples 78 are ultimately input into a time-varying QM2 sequence detector 88 which detects an estimated binary sequence ^b(n) 90 from the sample values. A post processor 95 generates a parity syndrome from the estimated binary sequence ^b(n) 90 which indicates when the sequence detector 88 has made a detection error. When an error is detected, the post processor 95 determines the most likely location within the estimated binary sequence ^b(n) 90 that the error occurred and corrects it. A QM2-Parity decoder 92 decodes the corrected binary sequence 97 into estimated user data 94. A data sync detector 96 detects the sync mark 26 (shown in FIG. 4B) in the data sector 16 in order to frame operation of the QM2-Parity decoder 92. In the absence of errors, the estimated binary sequence ^b(n) 90 matches the recorded binary sequence b(n) 38, and the decoded user data 94 matches the recorded user data 32. A detailed description of the time-varying QM2 sequence detector 88 and post processor 95, including the performance enhancing aspects of the QM2 and parity channel code, is provided below.

Time-Varying QM2 Sequence Detector and Post Processor

Figure 6:
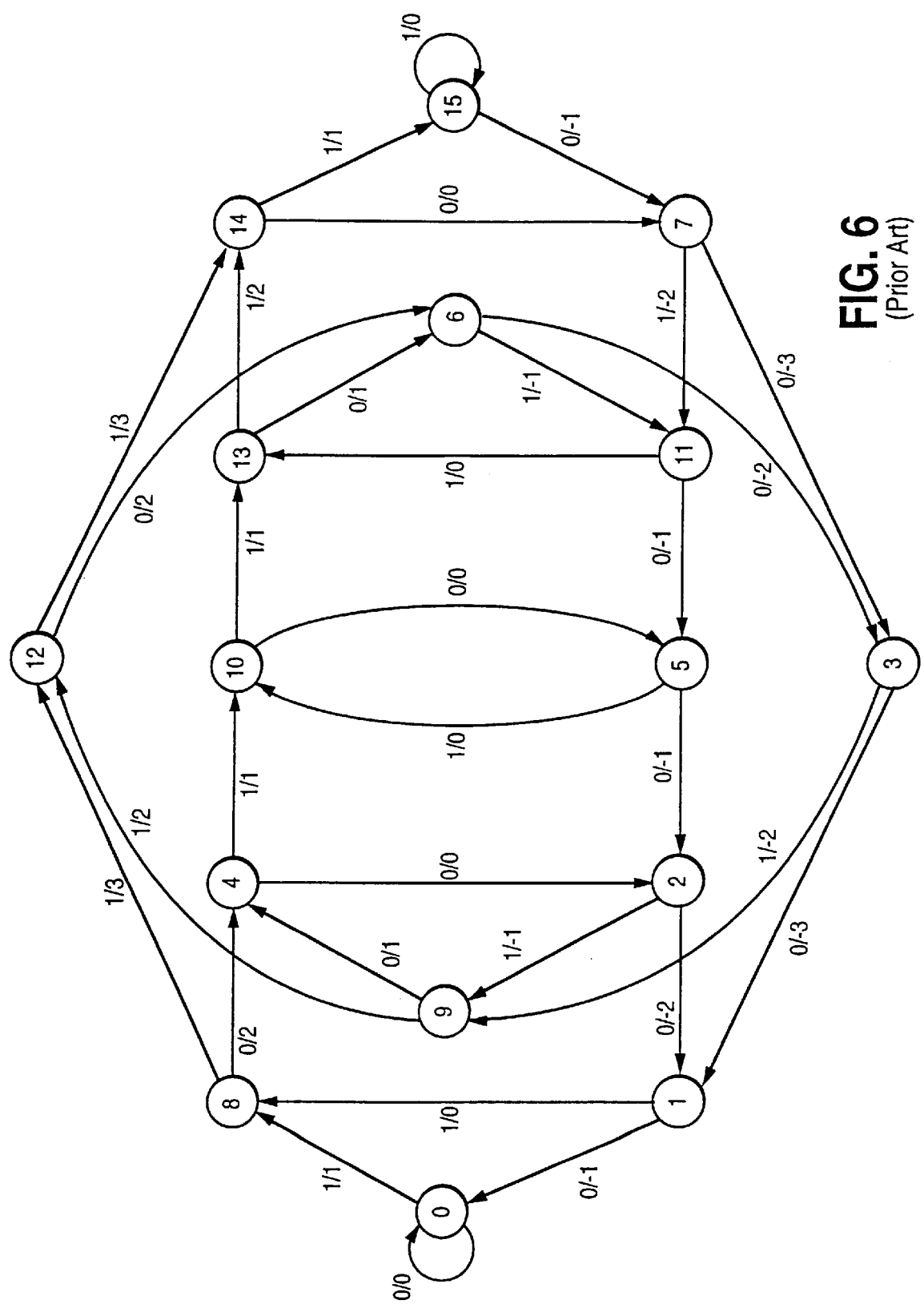
FIG. 6 is a state transition diagram for a full sixteen state EEPR4 sequence detector with the output bits labeled in NRZ.
Figure 7:
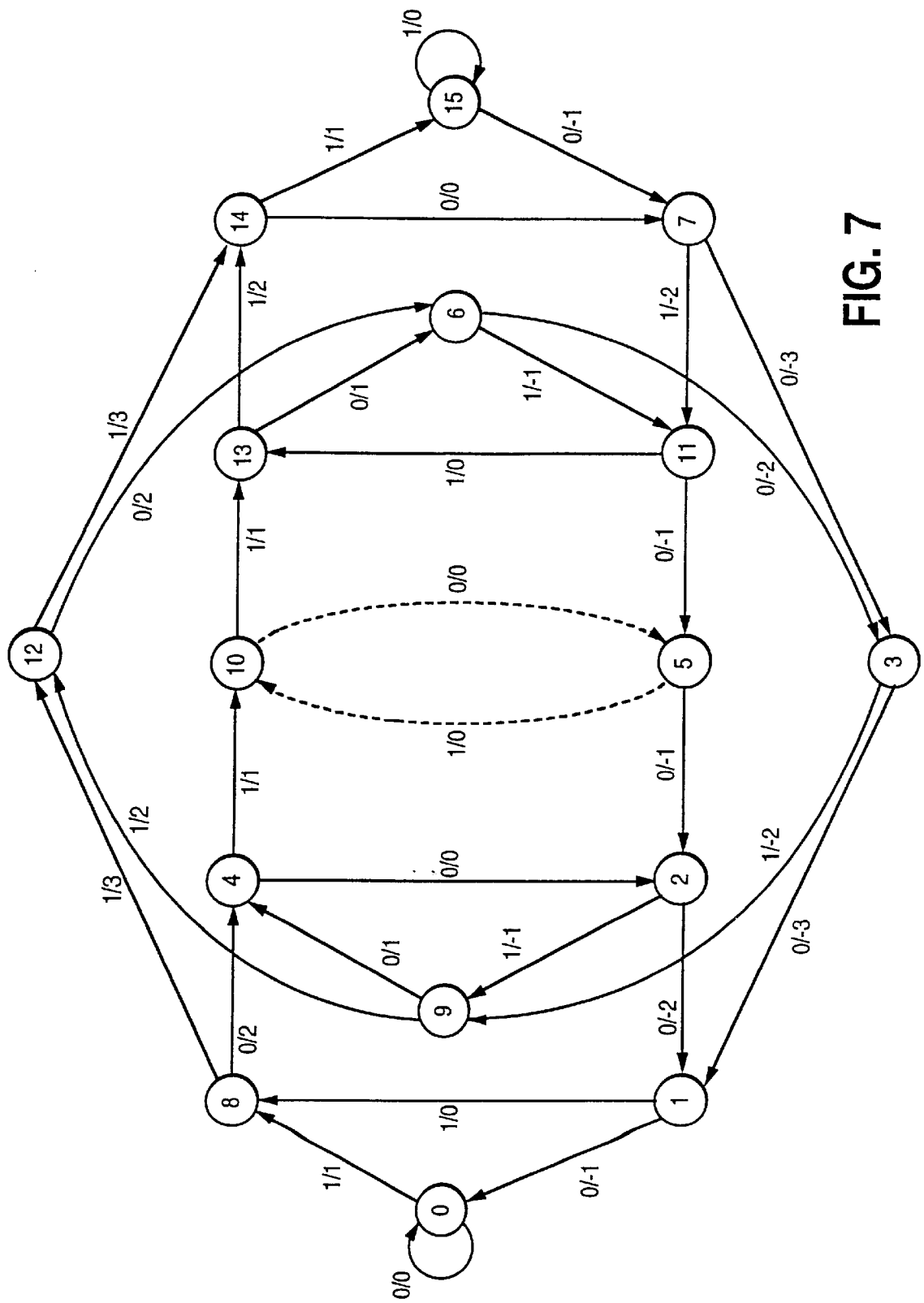
FIG. 7 is a state transition diagram for a sixteen state time varying EEPR4 sequence detector matched to the QM2 code constraints.

In the preferred embodiment of the present invention, the trellis sequence detector 88 of FIG. 5 is implemented in the EEPR4 domain. A conventional EEPR4 state transition diagram without the output bits labeled in NRZ and comprising sixteen states is shown in FIG. 6. To match the state transition diagram to the QM2 constraint, the inner branches between states 5 and 10 are deleted at every other symbol period (i.e., the state machine is time varying). This is illustrated in FIG. 7 which shows the inner branches between states 5 and 10 as dashed lines to signify that these branches exist in the trellis only at every other symbol period. Deleting these branches during the odd (or even) symbol periods matches the sequence detector to the QM2 constraint which allows quadbit transitions to begin only in the even (or odd) interleave. This provides a distance enhancing performance gain in the sequence detector by effectively coding out errors of the form {+−+−}, {+−+−+}, {+−+−+−}, etc. However, the QM2 constraint does not code out the shorter {+−+} minimum distance error event nor the dominant (+) error event.

To account for the error events not coded out by the QM2 code, the user data are encoded according to an error detection code (EDC), for example parity over a block of the write current 46 (NRZ write data). Alternatively, the parity can be generated over a block of the even or odd interleave of the write data in the NRZI domain (see the above referenced patent entitled "A PARITY CHANNEL CODE FOR ENHANCING THE OPERATION OF A REMOD/ DEMOD SEQUENCE DETECTOR IN A D=1 SAMPLED AMPLITUDE READ CHANNEL"). During a read operation, the post processor 95 of FIG. 5 generates an error syndrome over a block of the estimated read data to detect and correct errors caused by the (+) and (+−+) error events. The improvement provided by the parity channel code and post processor 95 approaches the performance gain achieved through matching the trellis state machine of the detector to the parity code constraint using conventional trellis coded modulation (TCM) techniques, but with a significant reduction in cost and complexity.

Figure 8A:
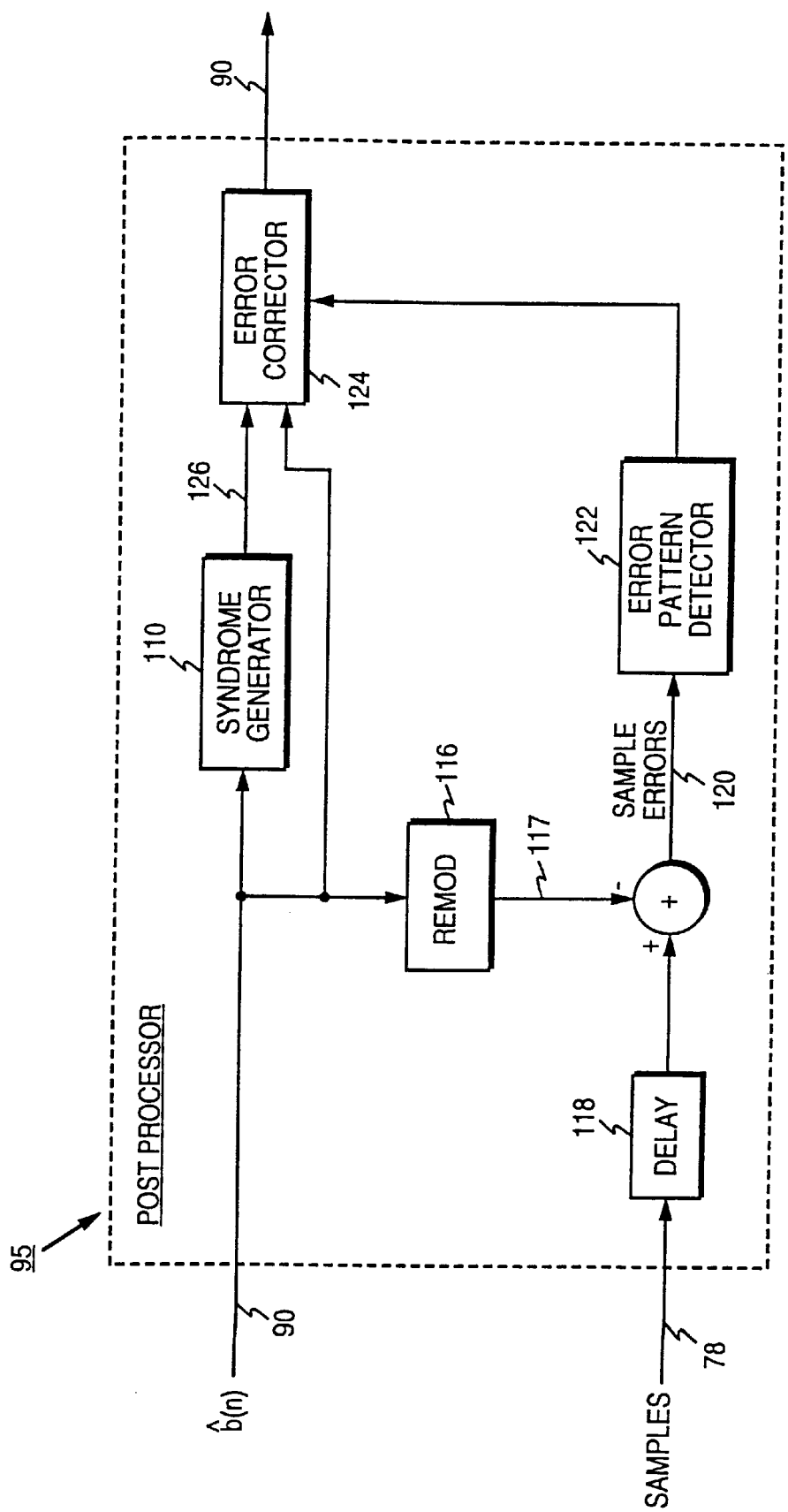
FIG. 8A shows details of the post-processor including a syndrome generator, remodulator, an error pattern detector, and an error corrector.

FIG. 8A shows a block diagram of the post processor 95 of FIG. 5. A remodulator 116 remodulates the binary sequence 90 output by the sequence detector 88 into an estimated sequence of ideal sample values 117 which are subtracted from the channel samples 78 (after passing through a delay 118 to account for the delay in the sequence detector 88) to generate a sequence of sample error values 120. An error pattern detector 122 processes the sequence of sample errors 120 to detect when the sequence detector 88 most likely made a detection error. The error pattern detector 122 comprises a plurality of finite-impulse-response (FIR) filters matched to the dominant error events of the sequence detector 88 (e.g., the NRZ (+) and (+−+) error events) not coded out by the QM2 code. When the error pattern detector 122 detects an error event, it signals an error corrector 124 to correct the binary sequence 90 output by the sequence detector 88. Although the error pattern detector 122 alone provides a significant performance gain, it may at times detect a false error event which leads to a miscorrection of the binary sequence 90.

The error detection code (EDC), which in the preferred embodiment is a simple parity code, decreases the probability of a miscorrection by detecting when an error occurs in a predetermined number of bits (i.e., a block or codeword) of the detected binary sequence 90. The syndrome generator 110 of FIG. 8A processes the detected binary sequence 90 output by the sequence detector 88 to generate an error syndrome 126 which indicates whether an error occurred in the EDC codeword. When an error is detected, the error corrector 124 corrects the detected binary sequence 90 using the error event detected by the error pattern detector 122 most likely to have caused the error (e.g., the maximum error event). In this manner, the probability of a miscorrection decreases because the error syndrome 126 of the EDC only allows a correction to occur when an error is present. A miscorrection can still occur if the selected error event used to make the correction is the wrong error event— nevertheless, it is still a significant improvement over the prior art.

An error that occurs in a current EDC codeword may propagate over the code word boundaries to the previous or following EDC code words. Circuitry is provided in the error pattern detector 122 to account for this possibility—an example embodiment for this circuitry is discussed in greater detail below with reference to FIGS. 8C–8F, and with reference to FIG. 8B which shows the preferred embodiment for the post processor 95 of the present invention.

As discussed above with reference to FIG. 5, the channel samples 78 are equalized into a PR4 response so that a simple slicer circuit can generate the estimated sample values for use by timing recovery 68 and gain control 80. The PR4 samples 78 are converted to EEPR4 samples by a simple $(1+D)^2$ filter 130 shown in FIG. 8B. An EEPR4 sequence detector 88 detects a preliminary NRZ sequence 90 from the EEPR4 samples, and the NRZ sequence 90 is then remodulated by remodulator 138 to generate a sequence of estimated sample values 140 similar to FIG. 8A. The estimated sample values 140 are subtracted from the PR4 channel samples 78 (after passing through a delay 142 to account for the delay in the EEPR4 detector 88) to generate a sequence of sample error values 144. A PR4/EPR4 error pattern detector 146 processes the sample error values 144 and saves the correction value and location of the most likely error event. A syndrome generator 148 generates an error syndrome (e.g., parity) over a block of the NRZ sequence 90 and, if the error syndrome indicates that the EEPR4 detector 88 made a detection error, a signed NRZI sequence 154 (generated by the remodulator 138) is corrected by an error corrector 150 using the most likely error event generated by the error pattern detector 146.

Figure 8B:
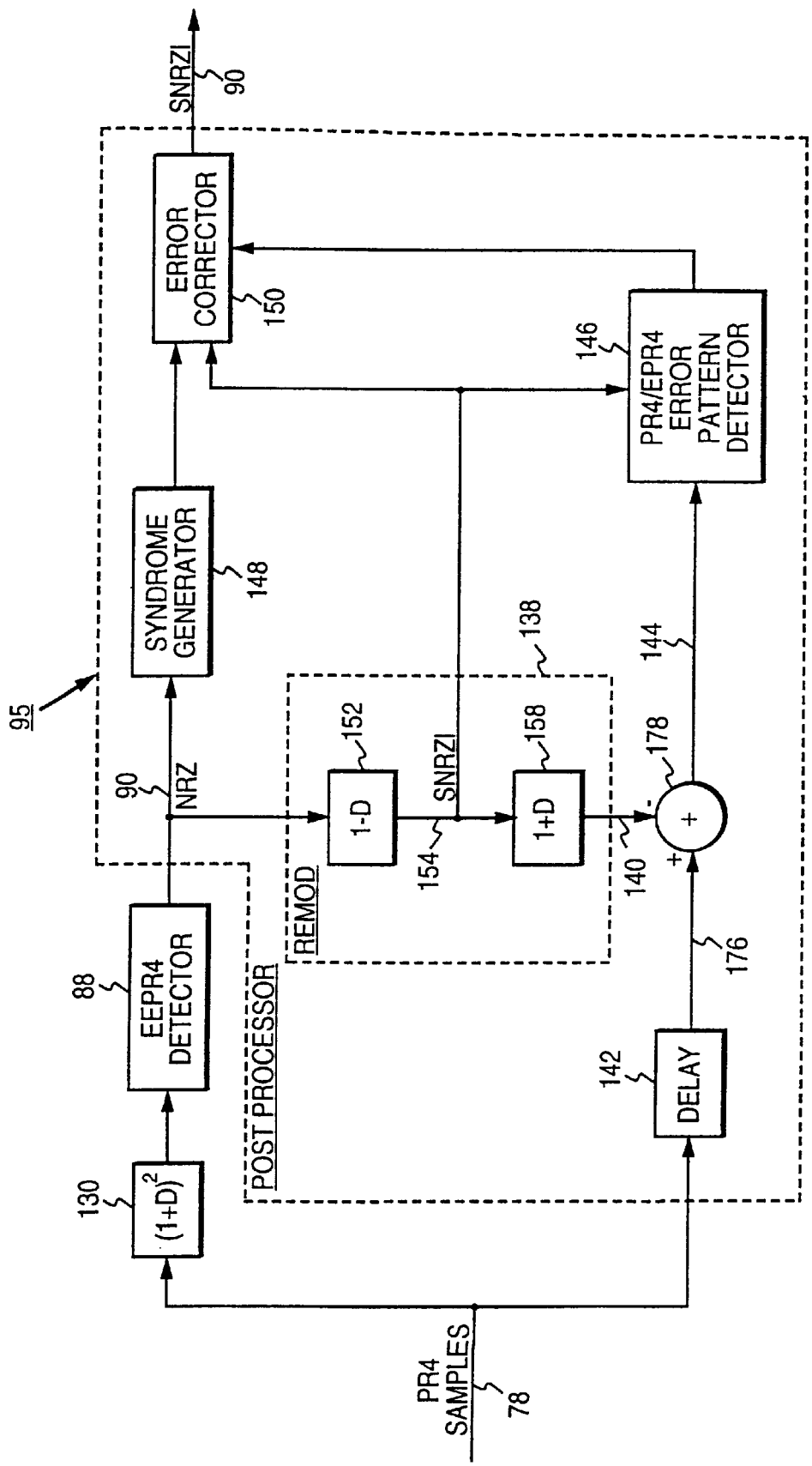
FIG. 8B shows further details of the preferred embodiment for the post-processor of FIG. 5.
Figure 8C:
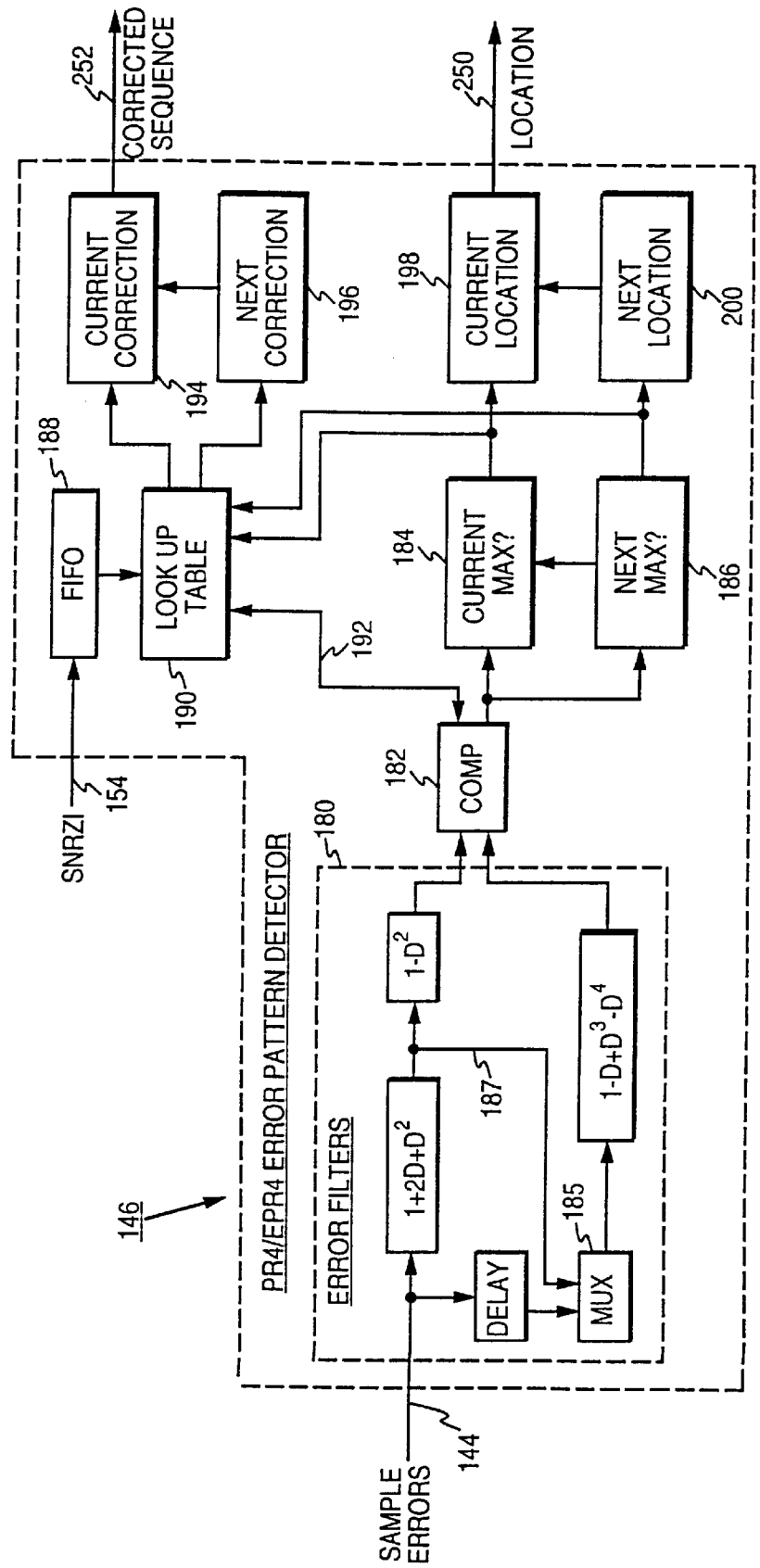
FIG. 8C shows details of the error pattern detector of the post-processor of FIG. 8A.

The remodulator 138 of FIG. 8B comprises a 1−D filter 152 for converting the NRZ sequence 90 into a signed NRZI (SNRZI) sequence 154, and a 1+D filter 158 for converting the SNRZI sequence 154 into a sequence of estimated PR4 sample values 140. The estimated PR4 sample sequence 140 is then subtracted from the actual read signal sample values 176 at adder 178 to generate the PR4 sample error sequence 144 processed by the error pattern detector 146. Further details of the error pattern detector 146 are shown in FIG. 8C.

Through computer simulations it was determined that, for user densities of 1.8 to 2.5, the most dominant error event (the (+) error event) is best detected in the EPR4 domain, while the next most dominant error event (the (+−+) error event) is best detected in the PR4 domain. Therefore, the PR4/EPR4 error pattern detector 146 of the present invention comprises two FIR filters 180 of the form:

$$(1+2D+D^2)(1-D^2) \text{ and}$$

$$1-D+D^3-D^4.$$

The first FIR filter is matched to the NRZ (+) or SNRZI (+1, −1) error event in the EPR4 domain, and the second FIR filter is matched to the NRZ (+−+) or SNRZI (+1, −2, +2, −1) error event in the PR4 domain.

To allow for further flexibility, a multiplexer 185 is provided to selectively configure the second FIR error filter to detect the error event in the EPR4 domain rather than in the PR4 domain. That is, the multiplexer 185 can select the intermediate output 187 from the first FIR filter in order to configure the second FIR filter into the form:

$$(1+2D+D^2)(1-D+D^3-D^4)$$

which is matched to the SNRZI (+1, −2, +2, −1) minimum distance error event in the EPR4 domain. Detecting both error events in the EPR4 domain may be desirable depending on the system dynamics and/or the recording density employed.

For each error sample input into the error pattern detector, a comparator 182 selects the FIR filter with the largest absolute magnitude output that corresponds to a valid error sequence as described below. The output of the comparator 182 is then compared to a "current maximum" at comparator 184 and to a next maximum at comparator 186. The "current maximum" saves the maximum FIR output for the current EDC code word being processed, and the "next maximum" saves the maximum FIR output for the following EDC code word.

The SNRZI sequence 154 generated by the remodulator 138 is buffered in a FIFO buffer 188 and compared to expected error sequences stored in a lookup table 190. As each new sample value is processed, the output of the error filters 180 index the lookup table 190 over line 192 to determine whether the detected SNRZI sequence 154 matches a valid error sequence. The comparator 182 will only compare the output of the error filters 180 with corresponding valid error sequences (the output of error filters corresponding to invalid error sequences are set to zero). When a potential error event is detected because the maximum valid FIR output 180 exceeds the current maximum or the next maximum at comparator 184 or 186, the lookup table 190 outputs a correction sequence corresponding to the detected error for the current and/or next EDC code word, and the correction sequences are saved in registers 194 and 196, respectively.

The lookup table 190 of FIG. 8C operates according to Table 2 and Table 3 below which show the expected SNRZI sequences resulting from the two detected error events, E1 and E2, and the corresponding corrected output sequences.

TABLE 2

| | SNRZI Error (+1, −1) | | | | | | | |
|---|---|---|---|---|---|---|---|---|
| | Expected SNRZI | | Corrected SNRZI | | | Expected SNRZI | | Corrected SNRZI | |
| E1 | $S_n$ | $S_{n-1}$ | $S_n$ | $S_{n-1}$ | E1 | $S_n$ | $S_{n-1}$ | $S_n$ | $S_{n-1}$ |
| E1 < 0 | +1 | −1 | +0 | +0 | E1 > 0 | −1 | +1 | −0 | −0 |
| E1 < 0 | −0 | −1 | −1 | +0 | E1 > 0 | +0 | +1 | +1 | −0 |
| E1 < 0 | +1 | −0 | +0 | +1 | E1 > 0 | −1 | +0 | −0 | −1 |
| E1 < 0 | −0 | −0 | −1 | +1 | E1 > 0 | +0 | +0 | +1 | −1 |

TABLE 3

| | SNRZI Error (+1, −2, +2, −1) | | | | | | | | | | | | | | | | |
|---|---|---|---|---|---|---|---|---|---|---|---|---|---|---|---|---|---|
| | Expected SNRZI | | | | Corrected SNRZI | | | | | Expected SNRZI | | | | Corrected SNRZI | | | |
| E2 | $S_n$ | $S_{n-1}$ | $S_{n-2}$ | $S_{n-3}$ | $S_n$ | $S_{n-1}$ | $S_{n-2}$ | $S_{n-3}$ | E2 | $S_n$ | $S_{n-1}$ | $S_{n-2}$ | $S_{n-3}$ | $S_n$ | $S_{n-1}$ | $S_{n-2}$ | $S_{n-3}$ |
| E2 < 0 | −0 | −1 | +1 | −0 | −1 | +1 | −1 | +1 | E2 > 0 | +0 | +1 | −1 | +0 | +1 | −1 | +1 | −1 |
| E2 < 0 | −0 | −1 | +1 | −1 | −1 | +1 | −1 | +0 | E2 > 0 | +0 | +1 | −1 | +1 | +1 | −1 | +1 | −0 |
| E2 < 0 | +1 | −1 | +1 | −0 | +0 | +1 | −1 | +1 | E2 > 0 | −1 | +1 | −1 | +0 | −0 | −1 | +1 | −1 |
| E2 < 0 | +1 | −1 | +1 | −1 | +0 | +1 | −1 | +0 | E2 > 0 | −1 | +1 | −1 | +1 | −0 | −1 | +1 | −0 |

The error events E1 and E2 can be positive or negative depending on the polarity of the sample error sequence 144. The detected SNRZI sequence stored in the FIFO buffer 188 of FIG. 8C are compared to the "Expected SNRZI" sequences in the above lookup tables to determine whether a valid correction can be made. The lookup table 190 may also include circuitry to evaluate the "corrected SNRZI" sequences in the above tables relative to the surrounding bits stored in the SNRZI FIFO 188 to determine whether a correction will violate the QM2 code constraint. If the QM2 constraint would be violated, the correction is deemed invalid and the output of the corresponding error filter is set to zero.

The outputs of comparators 184 and 186 enable the output of the lookup table 190 as well as indicate the location of the error event in the SNRZI sequence 154 for the current and next EDC code words. The location of the errors are stored in registers 198 and 200, respectively. When the parity syndrome generated by the parity generator 148 of FIG. 8B indicates a detection error in the current EDC code word, the error corrector 150 corrects the SNRZI sequence 154 using the corrected sequence stored in register 194 and the corresponding location of the error stored in register 198 of FIG. 8C.

The reason for storing the maximum FIR output and corresponding correction sequence and error location for the next EDC code word is because an error in the current EDC code word can propagate over the code word boundaries to the previous or next EDC code word. Therefore, the error pattern detector 146 searches for error events starting with the last two bits of the previous EDC code word and extending through the first three bits of the next EDC code word. This aspect of the present invention is better understood with reference to FIG. 8D which is a flow diagram executed when processing a data sector, and FIGS. 8E and 8F which illustrate both the parity generation and maximum error event detection, including the case where an error extends over the EDC code word boundaries.

Figure 8D:
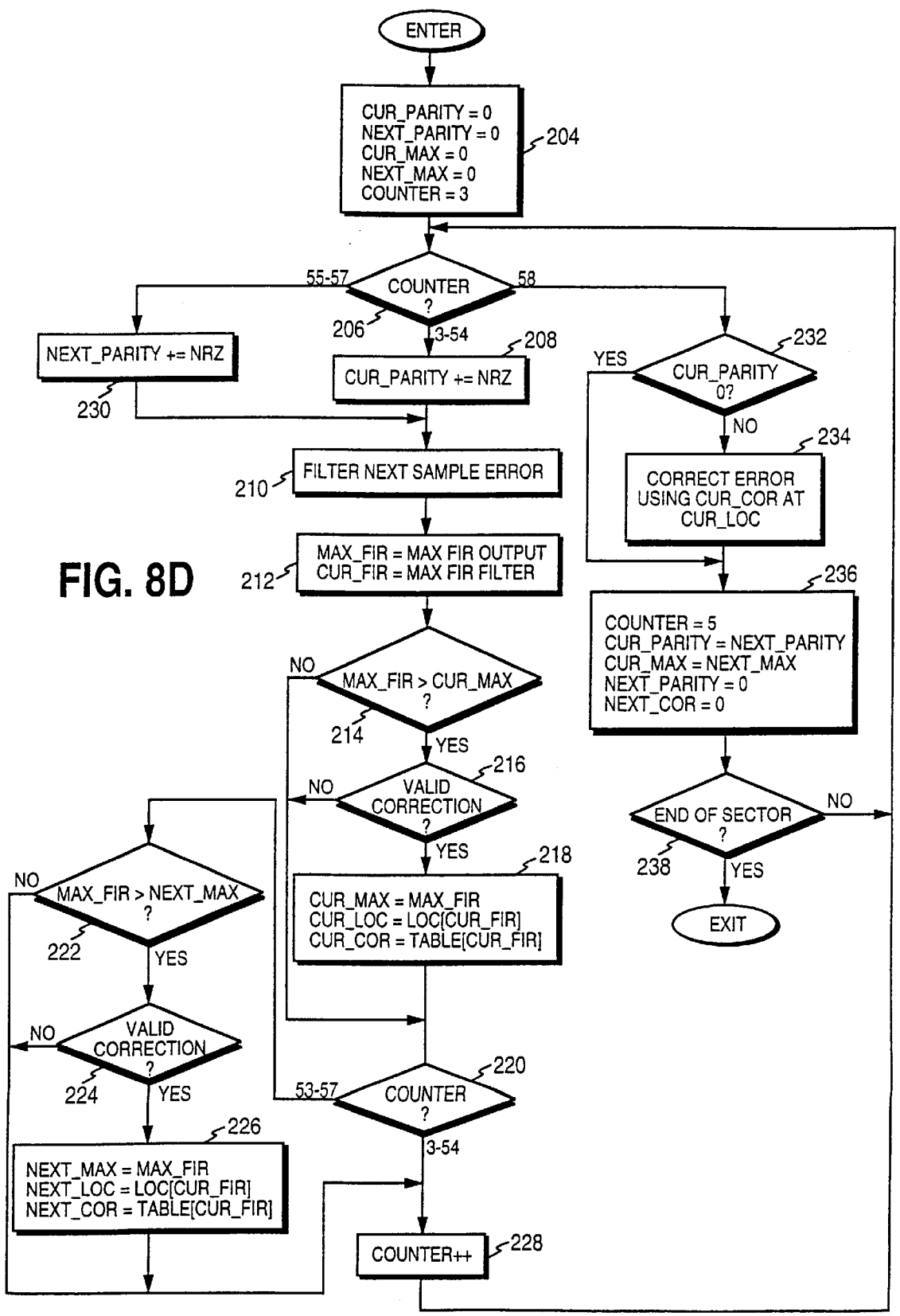
FIG. 8D is a flow chart describing the operation of the post-processor of FIG. 8A.
Figure 8E:
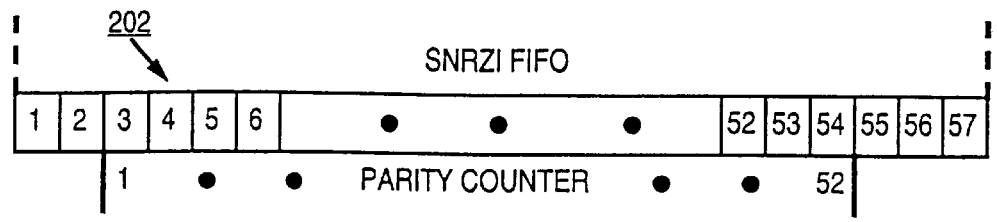
FIGS. 8E and 8F illustrate the syndrome generation (parity) when an error event occurs across code word boundaries.

In the preferred embodiment of the present invention, the EDC codewords comprise 52 bits with even parity in the NRZ domain (an even number of NRZ "1" bits). FIG. 8E shows 57 bits of a current sector buffered in a FIFO buffer 202, including the last two bits of a previous EDC code word, 52 bits of a current EDC code word, and the first three bits of the next EDC code word. The data stored in the FIFO buffer 202 is processed according to the flow diagram of FIG. 8D, wherein at step 204 the current parity CUR_PARITY, next parity NEXT_PARITY, current maximum FIR output CUR_MAX, and next maximum FIR output NEXT_MAX are initialized to zero. A COUNTER is initialized to 3 to start with the first bit of the first EDC code word of the sector as shown in FIG. 8E.

At step 206, a branch is executed depending on the current COUNTER value which represents a pointer into the FIFO buffer 202. If the COUNTER value is 3–54 at step 206, then the remod/demod detector is processing the data bits of a current EDC code word. At step 208, the current parity CUR_PARITY is updated with the current NRZ bit 90 output by the EEPR4 sequence detector 88, and at step 210, the current sample error value 144 is filtered by the FIR filters 180 in the error pattern detector 146 of FIG. 8C. The FIR filter with the maximum output MAX_FIR that corresponds to a valid correction sequence from Table 2 or Table 3 is selected at step 212, and the selected FIR filter is assigned to CUR_FIR. If the maximum FIR filter output MAX_FIR is greater than the current maximum CUR_MAX at step 214, then at step 216 the lookup table 190 of FIG. 8C compares the detected SNRZI sequence stored in FIFO buffer 188 to the expected SNRZI sequences that correspond to the detected error event as shown in Table 2 and Table 3. If there is a match at step 216 indicating that a valid correction can be made, then at step 218 the current maximum CUR_MAX is updated to MAX_FIR, the corresponding location of the detected error LOC[CUR_FIR] is assigned to CUR_LOC, and the corresponding correction sequence from Table 2 or Table 3 is assigned to CUR_COR. If the maximum FIR output $MAX_{13}$ FIR is not greater than the current maximum CUR_MAX at step 214, or if a valid correction cannot be made at step 216, then step 218 is skipped.

Another branch is executed at step 220 based on the current value of the COUNTER. If the COUNTER value is 53–57, then the error pattern detector 146 begins searching for the maximum error event in the next EDC code word. At step 222, the maximum FIR output is compared to NEXT_MAX, the maximum value saved for the next EDC code word. If greater, then again the lookup table 190 of FIG. 8C compares the detected SNRZI sequence stored in FIFO buffer 188 to the expected SNRZI sequences stored in Table 2 or Table 3. If there is a match at step 224 indicating that a valid correction can be made, then at step 226 the maximum FIR output for the next EDC code word NEXT_MAX is updated to MAX_FIR, the corresponding location of the detected error LOC[CUR_FIR] is assigned to NEXT_LOC, and the corresponding correction sequence from Table 2 or Table 3 is assigned to NEXT_COR. If the maximum FIR output MAX_FIR is not greater than NEXT_MAX at step 222, or if a valid correction cannot be made at step 224, then step 226 is skipped.

At step 228 the COUNTER is incremented and control branches to the beginning of the loop. If at step 206 the COUNTER value is 55–57, then the parity for the current EDC code word has been completely generated. Therefore, the parity for the next EDC code word is updated at step 230 by adding the current NRZ bit to NEXT_PARITY and skipping the parity update for the current EDC code word at step 208.

If the COUNTER value is 58 at step 206, then the error pattern detector 146 has completed processing the current EDC code word. Therefore, at step 232 the parity syndrome for the current EDC code word CUR_PARITY is evaluated. If non-zero, indicating that a detection error occurred, then at step 234 the error is corrected using the current correction sequence CUR_COR stored in register 194 of FIG. 8C and the current location CUR_LOC stored in register 198. Then at step 236, the system variables are re-initialized: the COUNTER is reset to 5; the current parity CUR_PARITY is set to NEXT_PARITY, the parity calculated for the next EDC code word; the current FIR maximum CUR_MAX is set to NEXT_MAX, the maximum FIR output saved for the next EDC code word; and the parity and correction sequence for the next EDC code word, NEXT_PARITY and NEXT_COR, are set to zero. Then the flow diagram of FIG. 8D is re-executed for the next EDC code word until the end of the sector is reached at step 238.

Figure 8F:
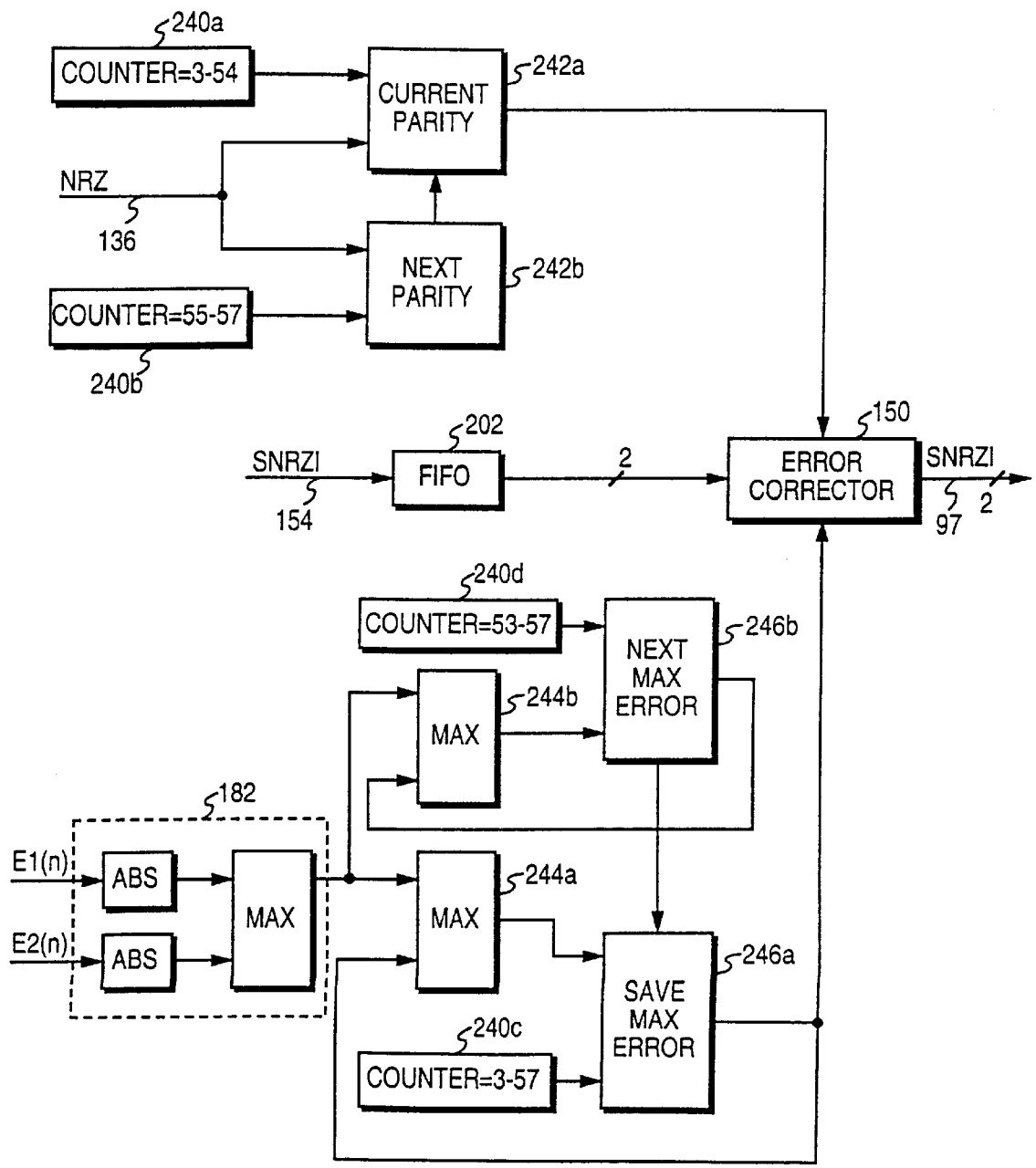

FIG. 8F shows further details of the circuitry employed to track the parity and maximum FIR error events for the current and next EDC code words. The detected NRZ sequence 90 output by the EEPR4 sequence detector 88 of FIG. 8B is accumulated for the current and next EDC code words in registers 242a and 242b, respectively. The parity for the current EDC code word is updated when the COUNTER 240a equals 3–54, and the parity for the next EDC code word is updated when the COUNTER 240b equals 55–57. When the COUNTER equals 58, the parity for the next EDC code word stored in register 242b is transferred to the parity for the current EDC code word in register 242a.

The SNRZI sequence 154 generated by the remodulator 138 of FIG. 8B is buffered in FIFO 202 shown in FIG. 8F, which is the same FIFO shown in FIG. 8E. When the parity for the current EDC code word stored in register 242a indicates that a detection error was made by the EEPR4 sequence detector 88, the error corrector 150 uses the maximum error event detected by the error pattern detector 146 to correct the error in the SNRZI sequence 154.

The two error events E1(n) and E2(n) detected by the two FIR error filters 180 of FIG. 8C are compared at comparator 182 and the maximum of the absolute value selected as the output of the comparator 182. The maximum error filter output is compared to the maximum for the current EDC code word at comparator 244a when the COUNTER 240c equals 3–57, and to the maximum for the next EDC code word at comparator 244*b* when the COUNTER 240*d* equals 53–57. The maximum error event (location and correction sequence) for the current EDC code word is stored in register 246*a*, and the maximum error event for the next EDC code word is stored in register 246*b*. When the COUNTER equals 58, the maximum error event (location and correction sequence) for the current EDC code word is used to correct the current EDC code word if the current parity stored in register 242*a* is non-zero. Then the maximum error event (correction and location sequence) for the next EDC code word stored in register 246*b* is transferred to the current maximum error event stored in register 246*a*. The COUNTER is reset to 5, and the procedure begins again for the next EDC code word.

Figure 8G:
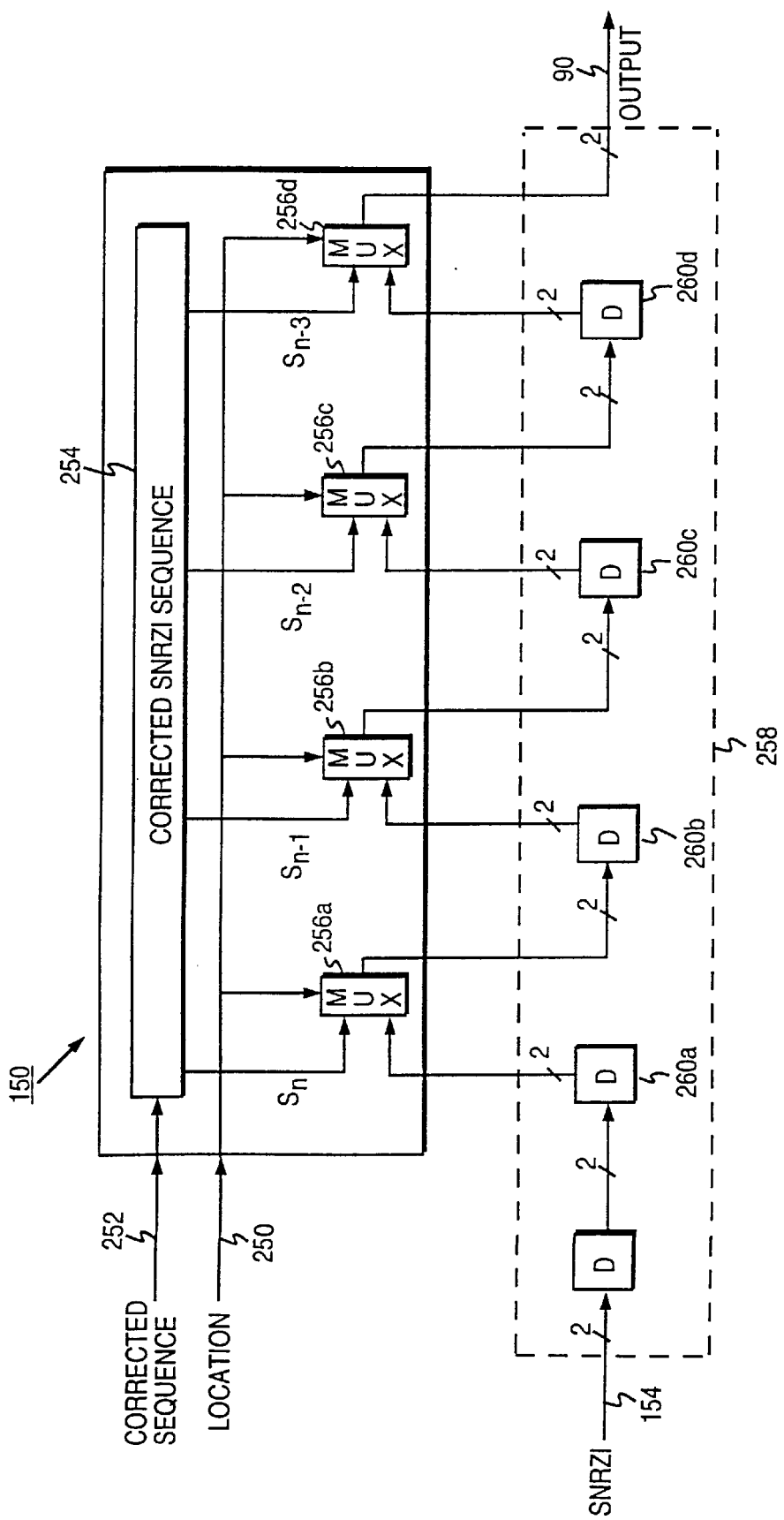
FIG. 8G is a block diagram of the error corrector in the post-processor of FIG. 8A.

A better understanding of how the error corrector 150 of FIG. 8B corrects an error in the detected SNRZI sequence is understood with reference to the block diagram of FIG. 8G. When the error syndrome (parity) generated by the syndrome generator 148 of FIG. 8B indicates a detection error occurred in the current EDC code word, the error corrector 150 receives from the PR4/EPR4 error pattern detector 146 of FIG. 8C the location of the maximum error event over line 250 and the corresponding corrected SNRZI sequence over line 252. The corrected SNRZI sequence is stored in register 254 and applied to a first input of multiplexers 256*a*–256*d*. The detected SNRZI sequence 154 is shifted through a shift register 258, wherein the output of delay elements 260*a*–260*d* are applied to a second input of multiplexers 256*a*–256*d*. The location of the maximum error event, LOCATION 250, controls the operation of the multiplexers 256*a*–256*d* in order to replace the erroneous bits in the detected SNRZI sequence with the corrected SNRZI sequence at the appropriate time. The output lines of register 254 labeled $S_n$, $S_{n-1}$, $S_{n-2}$ and $S_{n-3}$ correspond to the corrected SNRZI sequences shown in Table 2 and Table 3 discussed above.

QM2-Parity Encoder

The manner in which the QM2-Parity encoder 36 of FIG. 5 encodes the user data 32 according to the QM2 and parity constraints will now be discussed. A significant design criteria is to implement the code constraints using the highest practical code rate (the number of user bits per channel codeword) in order to maximize the system's efficiency and storage capacity, where "practical" means the most cost effective implementation. The highest possible code rate or "capacity" of a QM2 code is 0.9613, but the expense in implementing this rate is prohibitive. The present invention achieves a code rate of 48/52 (0.9231) using cost effective encoding circuitry derived through the use of a novel encoding technique.

Figure 9A:
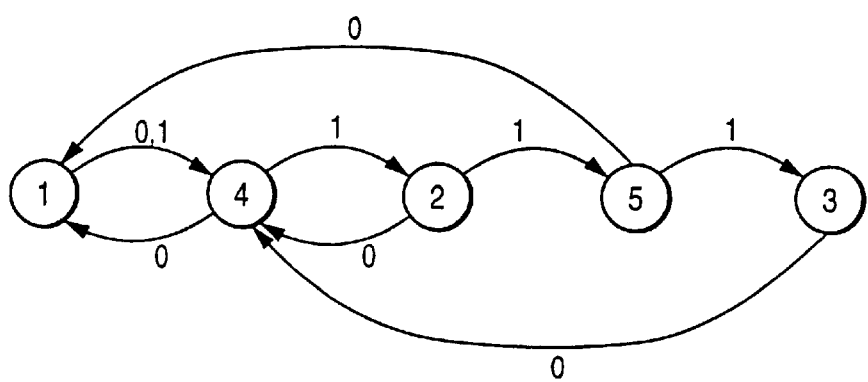
FIG. 9A is the state transition diagram (STD) for the QM2 of the present invention.

The state transition diagram (STD) for the QM2 code constraint is shown in FIG. 9A which has the following transition matrix:

$$\begin{bmatrix} 0 & 0 & 0 & 2 & 0 \\ 0 & 0 & 0 & 1 & 1 \\ 0 & 0 & 0 & 1 & 0 \\ 1 & 1 & 0 & 0 & 0 \\ 1 & 0 & 1 & 0 & 0 \end{bmatrix}$$

Figure 9B:
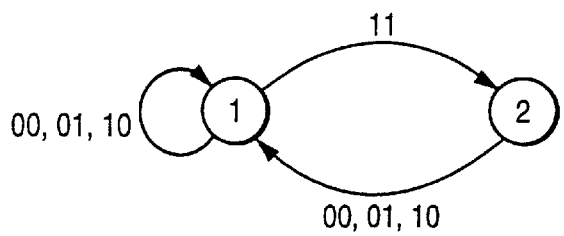
FIG. 9B is the two-state STD corresponding to the 2nd power of the STD of FIG. 9A.

Taking the 2nd power of this matrix leads to two matrices and corresponding STDs, one with two states and the other with three states. The 2nd power, two-state STD is shown in FIG. 9B, which has a transition matrix of:

$$\begin{bmatrix} 3 & 1 \\ 3 & 0 \end{bmatrix}$$

Figure 9C:
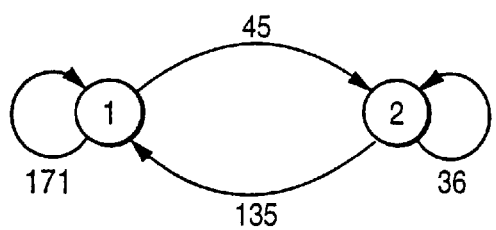
FIG. 9C is the two-state STD corresponding to the 4th power of the STD of FIG. 9B and the 8th power STD of FIG. 9A.
Figure 9D:
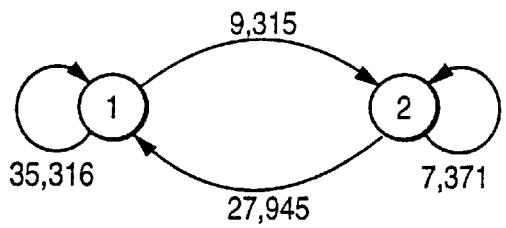
FIG. 9D is the two-state STD corresponding to the 2nd power of the STD of FIG. 9C and the 16th power of the STD of FIG. 9A.

Taking the 4th and 8th power of the above 2nd power matrix (the 8th and 16th powers of the original matrix) yields the STDs shown in FIGS. 9C and 9D, respectively.

Note that the 16th power STD of FIG. 9D has more than enough branches leaving state one and ending in state one to create a rate 15/16 code (32,768 minimum required). The 16th power STD of FIG. 9D can be constructed from two uses of the 8th power STD of FIG. 9C. In order to simplify the implementation of the encoder, a number of branches are removed while still retaining enough branches in the two uses of the 8th power STD to implement the rate 15/16 code. By deleting from the STD of FIG. 9C three of the branches in the self loop to state one, five of the branches from state one to two, all of the branches in the self loop to state two, and seven of the branches from state two to state one leads to the modified 8th power STD of FIG. 9E. Two uses of the STD of FIG. 9E leads to the modified 16th power STD of FIG. 9F which has fewer overall branches than the 16th power STD of FIG. 9D, but still enough in the self loop to state one to implement a rate 15/16 code.

Figure 9E:
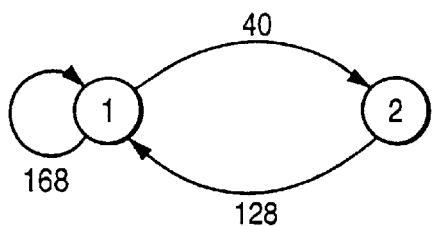
FIG. 9E is a two-state STD generated by deleting certain branches of the STD of FIG. 9C.
Figure 9F:
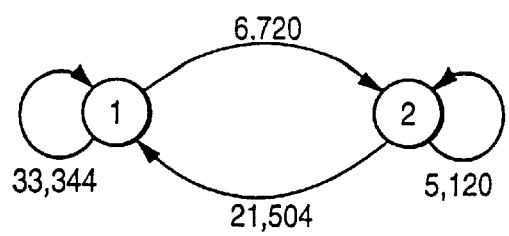
FIG. 9F is the two-state STD corresponding to the 2nd power of the STD of FIG. 9E.
Figure 10A:
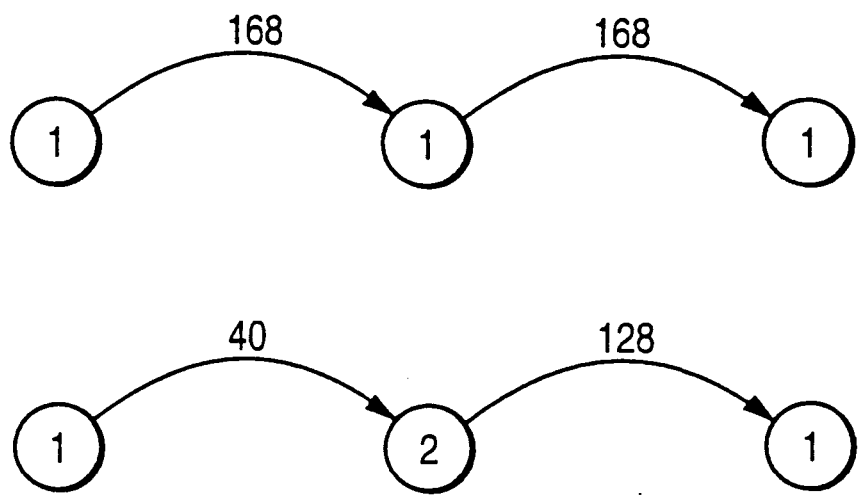
FIG. 10A shows the state sequences selected to implement a rate 15/16 QM2 code using two instances of the STD of FIG. 9E.

All of the sequences in the self loop to state one in the modified 16th power STD of FIG. 9F can be generated from two uses of the modified 8th power STD of FIG. 9E. There are two possible state sequences, both of which start and end in state one: transition from 1->1->1 or transition from 1->2->1. This is illustrated in FIG. 10A which shows the two possible state sequences labeled with the number of branches in the modified 8th power STD of FIG. 9E. The product of the labels yields the total number of sequences available for each legal state transition sequence, and each valid codeword in the 15/16 code corresponds to one of the two valid state transition sequences.

Figure 10B:
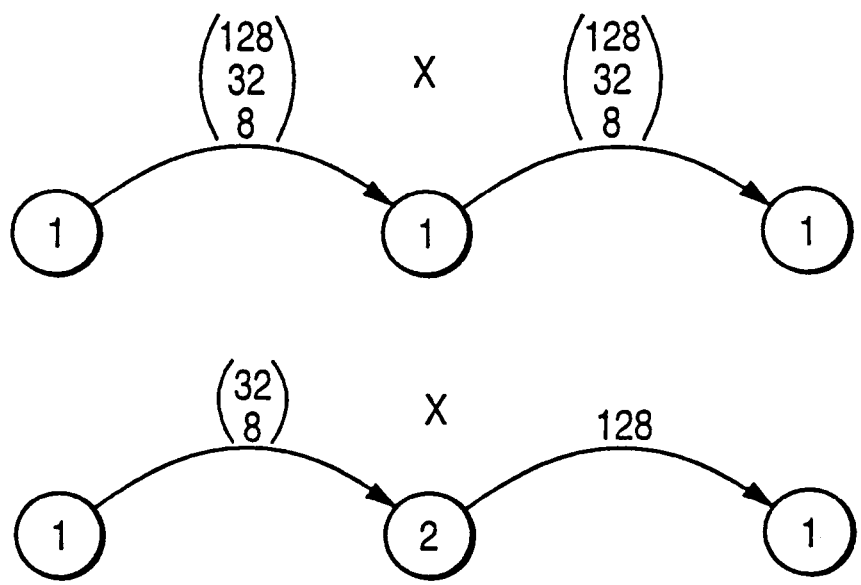
FIG. 10B shows how the codeword sets of the state branches of FIG. 10A are factored into powers of two to achieve a simple addressing scheme in the encoder.

A further reduction in complexity is achieved by factoring the branches emanating from each state in FIG. 10A into powers of two which allows for a simple addressing scheme. This is illustrated in FIG. 10B which shows the 168 branches in the 1->1 sequence factored into (128, 32, 8), the 40 branches in the 1->2 sequence factored into (32, 8), and the 128 branches in the 2->1 sequence unmodified. The total number of 16-bit codewords that can be generated is determined by taking the cross products of the factored branches as shown in Table 4:

TABLE 4

| Cross Product | Number of Codewords |
|---|---|
| $128_{11} \times 128_{11}$ | 16,384 |
| $128_{11} \times 32_{11}$ | 4096 |
| $32_{11} \times 128_{11}$ | 4096 |
| $32_{12} \times 128_{21}$ | 4096 |
| $128_{11} \times 8_{11}$ | 1024 |
| $32_{11} \times 32_{11}$ | 1024 |
| $8_{11} \times 128_{11}$ | 1024 |
| $8_{12} \times 128_{21}$ | 1024 |
| $8_{11} \times 32_{11}$ | 256 |
| $32_{11} \times 8_{11}$ | 256 |
| $8_{11} \times 8_{11}$ | 64 |
| Total: | 33,344 |

Since the total number of 16-bit codewords that can be generated (33,344) is greater than that needed (32,768), the last three cross products are deleted leaving exactly the number of codewords needed to implement a rate 15/16 code as shown in Table 5:

TABLE 5

| Cross Product | Number of Codewords |
| --- | --- |
| $128_{11} \times 128_{11}$ | 16,384 |
| $128_{11} \times 32_{11}$ | 4096 |
| $32_{11} \times 128_{11}$ | 4096 |
| $32_{12} \times 128_{21}$ | 4096 |
| $128_{11} \times 8_{11}$ | 1024 |
| $32_{11} \times 32_{11}$ | 1024 |
| $8_{11} \times 128_{11}$ | 1024 |
| $8_{12} \times 128_{21}$ | 1024 |
| Total: | 32,768 |

Figure 11:
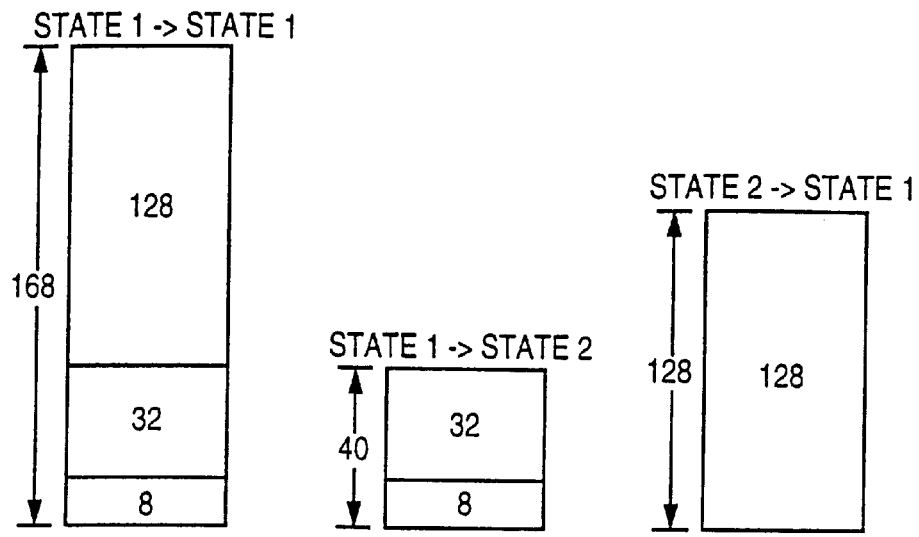
FIG. 11 shows the memory banks used to implement the possible codeword concatenations of FIG. 10B.

Notice that Table 5 comprises eight entries using six different subset branches: $128_{11}$, $32_{11}$, $8_{11}$, $32_{12}$, $8_{12}$, and $128_{21}$. The subset branches for each transition sequence can be stored in memory banks as shown an FIG. 11, and the appropriate memory banks selected to form the 16-bit output codeword. Using 3 bits to represent the six subset of branches, it requires 8×3×2=6 bytes total to specify the transition sequence for any particular 15-bit input codeword. The most significant 5 bits of the 15-bit input codeword are used to select an entry in Table 5, where each entry in table 5 comprises two 3-bit sequences for selecting the corresponding memory bank in FIG. 11. The least significant 14 bits of the 15 bit input codeword are used to select a specific branch from the two subset branches, and the selected branches are then concatenated to form the 16-bit output codeword.

Figure 12:
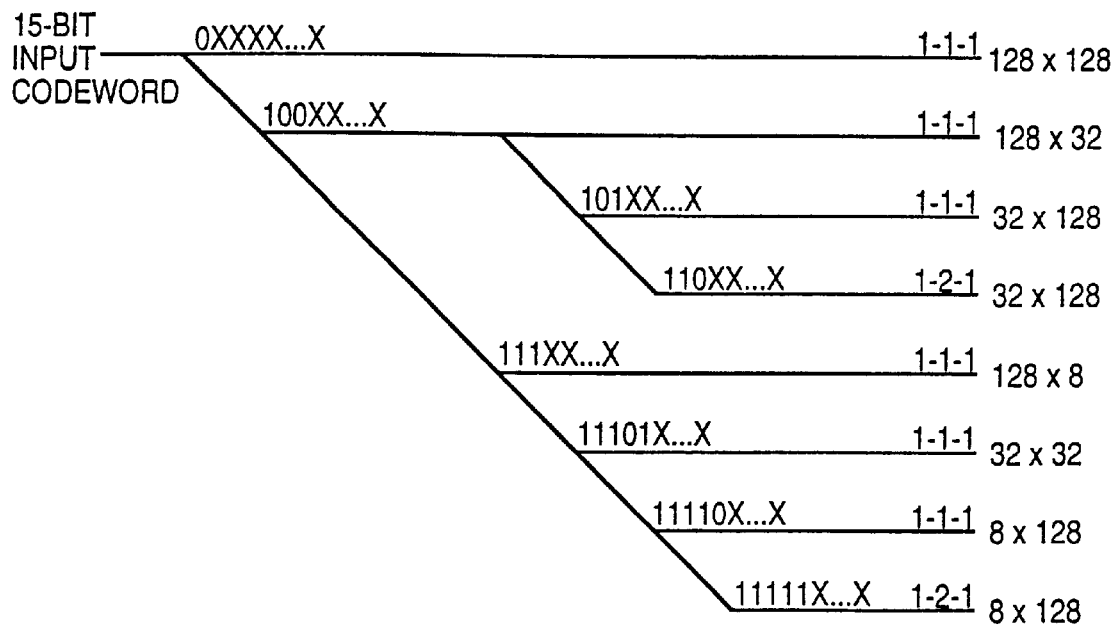
FIG. 12 is a tree diagram illustrating the encoding method for the rate 15/16 QM2 code.

The encoding process is further understood from the code tree of FIG. 12, which implements the following encoding algorithm with the 15-bit input codeword represented as $b_{14}$–$b_0$:

1. If $b_{14}$ is zero, then select the concatenation of $128_{11} \times 128_{11}$ with the remaining fourteen bits ($b_{13}$–$b_0$) divided into two groups of seven for selecting two 8-bit sequences from the $128_{11}$ memory bank of FIG. 11.
2. If $b_{14}$ is one, then if the next two bits ($b_{13}$,$b_{12}$) equal:
   00—select the concatenation $128_{11} \times 32_{11}$ with the next seven bits ($b_{11}$–$b_5$) used to select an 8-bit sequence from the $128_{11}$ memory bank and the last five bits ($b_4$–$b_0$) used to select an 8-bit sequence from the $32_{11}$ memory bank.
   01—select the concatenation $32_{11} \times 128_{11}$ with the next five bits ($b_{11}$–$b_7$) used to select an 8-bit sequence from the $32_{11}$ memory bank and the last seven bits ($b_6$–$b_0$) used to select an 8-bit sequence from the $128_{11}$ memory bank.
   10—select the concatenation $32_{12} \times 128_{21}$ with the next five bits ($b_{11}$–$b_7$) used to select an 8-bit sequence from the $32_{12}$ memory bank and the last seven bits ($b_6$–$b_0$) used to select an 8-bit sequence from the $128_{21}$ memory bank.
3. If the first three bits ($b_{14}$–$b_{12}$) are one, then the next two bits ($b_{11}$,$b_{10}$) are used to select the appropriate memory banks with the remaining 10 bits ($b_9$–$b_0$) split into groups of 7+3, 5+5, 3+7, and 3+7, respectively and used to select an 8-bit sequence from the appropriate memory banks of FIG. 11.

The total memory required to implement the above encoding scheme is easily computed. There are a total of 128+32+8+32+8+128 8-bit sequences stored in the memory banks of FIG. 11 for a total of 336 bytes. The encoding tree of FIG. 12 can be hardwired, or it can be implemented using a lookup table comprising 8 entries of two 3-bit addresses for the two memory banks in each entry of Table 5 (i.e., a total of 6 additional bytes). This is a significant reduction in hardware compared to a straight 15-to-16 lookup table which requires $2^{15} \times 16$ bits or 65,536 bytes.

Figure 13A:
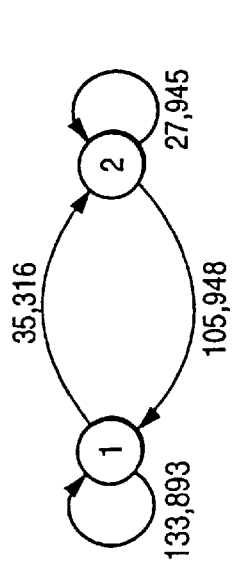
FIGS. 13A–13G show the state transition diagrams used to generate a rate 17/18 QM2 code using a technique similar to that used to generate the rate 15/16 QM2 code.
Figure 13B:
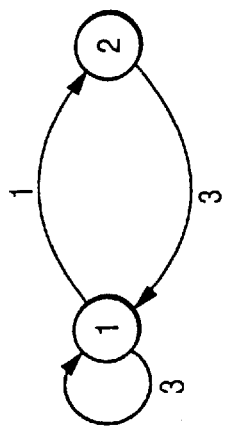
Figure 13C:
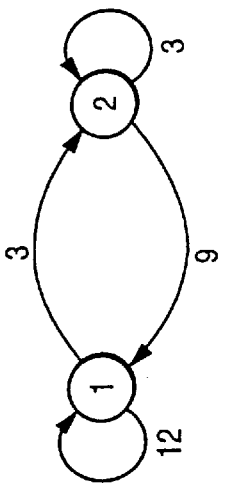
Figure 13D:
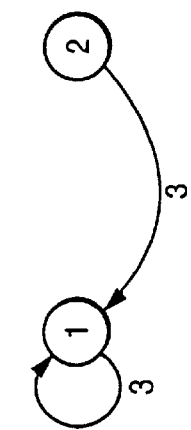
Figure 13E:
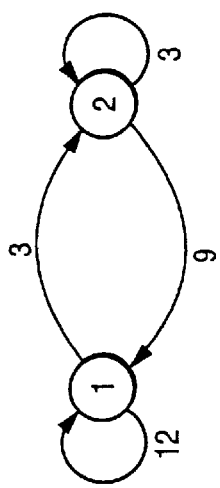
Figure 13F:
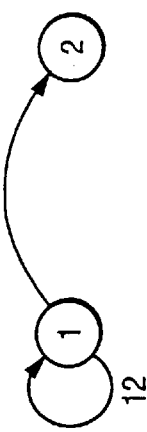
Figure 13G:
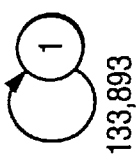

The above encoding method can be extended to create even higher code rates with a moderate increase in complexity. Further, the present invention encoding method is not restricted to the 8th power STD; other powers may actually simplify the design. For example, it is possible to create a rate 17/18 code with four uses of a 4th power STD, followed by a 2nd power STD. This is illustrated in FIGS. 13A–13G. FIG. 13A is the 4th power STD of FIG. 9A, FIG. 13B is the 2nd power STD, and FIG. 13C is the concatenation of four 4th power STDs followed by one 2nd power STD. Note that there are enough branches in the self loop to state one in the STD of FIG. 13C to implement a rate 17/18 code. FIG. 13D is the 4th power STD of FIG. 13A with all branches from state two removed since the codeword sequences always begin in state one. FIG. 13E is the 4th power STD unmodified, and FIG. 13F is the 2nd power STD of FIG. 13B with all branches ending in state two removed since the codeword sequences always end in state one. Concatenating the STD of FIG. 13D with three uses of FIG. 13E and one use of FIG. 13F results in the STD of FIG. 13G, a simple block code with enough branches in the self loop of state one to implement a rate 17/18 code. There are sixteen allowable state sequences of this particular concatenation starting and ending in state one.

In the preferred embodiment of the present invention, a rate 48/52 QM2 code with even parity in the write current is constructed by concatenating two uses of a rate 17/18 code and one use of a rate 14/16 code. The parity of the two 17/18 codewords is generated and then the parity of the rate 14/16 codeword is selected such that the overall parity of the rate 48/52 codeword is even. This is accomplished by dividing the codebook for a rate 15/16 QM2 code into two codebooks comprising codewords of even and odd parity.

Figure 14:
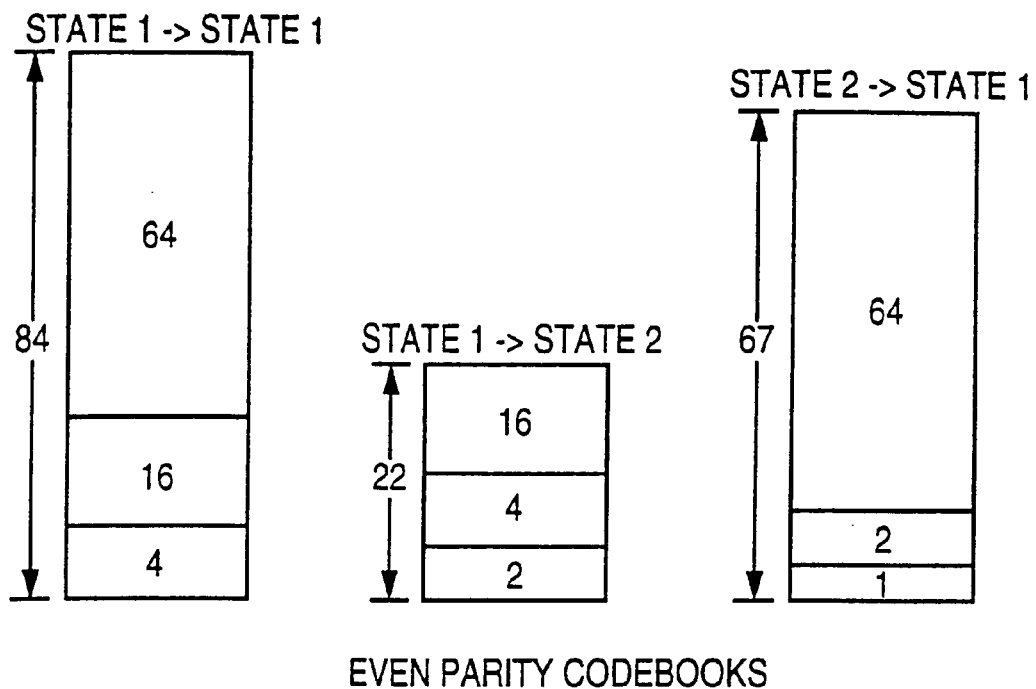
FIG. 14 shows the memory banks of the rate 15/16 QM2 code divided into memory banks of even and odd parity which are used to implement the parity error detection code for the post-processor of FIG. 8A.
Figure 14:
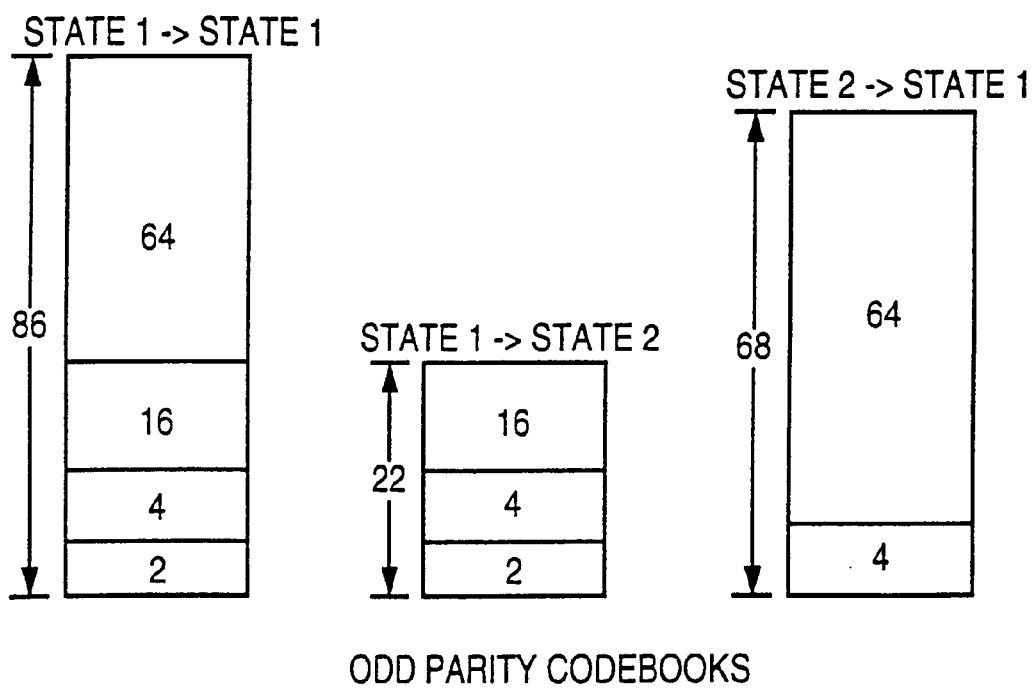

The original 15/16 QM2 code (FIG. 9C) comprises 171 branches in the self loop to state one which are divided into 84 even parity codewords and 86 odd parity codewords as shown in Table 6. From state one to state two, there are 45 original branches that are divided into 22 even parity codewords and 22 odd parity codewords. And from state two to state one there are 135 original branches that are divided into 67 even parity codewords and 68 odd parity codewords. FIG. 14 shows the even and odd parity codebooks, including how the memory banks for each codeword set are divided into powers of two.

Constructing the 16-bit output codeword is essentially the same as above. A code tree (or lookup table) is used to select two 8-bit codewords from the memory banks of FIG. 14, with one bit from the 15-bit input codeword used to select between even and odd parity. An even parity 16-bit codeword is generated by concatenating even-even or odd-odd 8-bit codewords, and an odd parity 16-bit codeword is generated by concatenating even-odd or odd-even 8-bit codewords. The code tree (or lookup table) is constructed such that enough permutations of the memory banks in FIG. 14 are used to generate the required $2 \times 2^{14}$ or 32,768 16-bit codewords.

The memory banks of FIG. 14 are constructed with 8-bit codewords that will generate the desired parity in the write sequence ~b(n) 46 of FIG. 5. The precoder 40 in FIG. 5 is a simple 1/(1−D) filter, therefore the 8-bit codewords are selected such that the NRZ parity in the write sequence ~b(n) 46 will be even or odd at the output of the precoder 40. The following table lists the 8-bit codewords for the even and odd codebooks of FIG. 14:

TABLE 6

| 1->1 EVEN | | 1->2 EVEN | 2->1 EVEN | | 1->1 ODD | | 1->2 ODD | 2->1 ODD | |
|---|---|---|---|---|---|---|---|---|---|
| 2 | 5 | 7 | 2 | 5 | 1 | 4 | 3 | 1 | 4 |
| 8 | 10 | 19 | 8 | 10 | 6 | 9 | 11 | 6 | 9 |
| 13 | 17 | 27 | 13 | 17 | 12 | 14 | 23 | 12 | 14 |
| 20 | 22 | 39 | 20 | 22 | 16 | 18 | 35 | 16 | 18 |
| 25 | 28 | 59 | 25 | 28 | 21 | 24 | 43 | 21 | 24 |
| 30 | 32 | 67 | 30 | 32 | 26 | 29 | 55 | 26 | 29 |
| 34 | 37 | 75 | 34 | 37 | 33 | 36 | 71 | 33 | 36 |
| 40 | 42 | 87 | 40 | 42 | 38 | 41 | 83 | 38 | 41 |
| 45 | 49 | 99 | 45 | 49 | 44 | 46 | 91 | 44 | 46 |
| 52 | 54 | 107 | 52 | 54 | 48 | 50 | 103 | 48 | 50 |
| 57 | 65 | 119 | 57 | 65 | 53 | 56 | 115 | 53 | 56 |
| 68 | 70 | 135 | 68 | 70 | 58 | 64 | 123 | 58 | 64 |
| 73 | 76 | 147 | 73 | 76 | 66 | 69 | 131 | 66 | 69 |
| 78 | 80 | 155 | 78 | 80 | 72 | 74 | 139 | 72 | 74 |
| 82 | 85 | 167 | 82 | 85 | 77 | 81 | 151 | 77 | 81 |
| 88 | 90 | 179 | 88 | 90 | 84 | 86 | 163 | 84 | 86 |
| 93 | 97 | 187 | 93 | 97 | 89 | 92 | 171 | 89 | 92 |
| 100 | 102 | 195 | 100 | 102 | 94 | 96 | 183 | 94 | 96 |
| 105 | 108 | 203 | 105 | 108 | 98 | 101 | 199 | 98 | 101 |
| 110 | 112 | 215 | 110 | 112 | 104 | 106 | 211 | 104 | 106 |
| 114 | 117 | 227 | 114 | 117 | 109 | 113 | 219 | 109 | 113 |
| 120 | 122 | 235 | 120 | 122 | 116 | 118 | 231 | 116 | 118 |
| 128 | 130 | | 128 | 130 | 121 | 129 | | 121 | 129 |
| 133 | 136 | | 133 | 136 | 132 | 134 | | 132 | 134 |
| 138 | 141 | | 138 | 141 | 137 | 140 | | 137 | 140 |
| 145 | 148 | | 145 | 148 | 142 | 144 | | 142 | 144 |
| 150 | 156 | | 150 | 156 | 146 | 149 | | 146 | 149 |
| 158 | 160 | | 158 | 160 | 152 | 154 | | 152 | 154 |
| 162 | 165 | | 162 | 165 | 157 | 161 | | 157 | 161 |
| 168 | 170 | | 168 | 170 | 164 | 166 | | 164 | 166 |
| 173 | 177 | | 173 | 177 | 169 | 172 | | 169 | 172 |
| 180 | 182 | | 180 | 182 | 174 | 176 | | 174 | 176 |
| 185 | 193 | | 185 | 153 | 178 | 181 | | 178 | 181 |
| 196 | 198 | | 0 | | 184 | 186 | | 184 | 186 |
| 201 | 204 | | | | 192 | 194 | | | |
| 206 | 208 | | | | 197 | 200 | | | |
| 210 | 213 | | | | 202 | 205 | | | |
| 216 | 218 | | | | 209 | 212 | | | |
| 221 | 225 | | | | 214 | 217 | | | |
| 228 | 230 | | | | 220 | 222 | | | |
| 233 | 236 | | | | 224 | 226 | | | |
| 238 | 153 | | | | 229 | 232 | | | |
| | | | | | 234 | 237 | | | |

QM2-Parity decoder 92 of FIG. 5 performs the reverse operation of the encoding process set forth above. First it decodes the two 18-bit codewords according to the 17/18 code, and then it decodes the 16-bit codeword according to the 15/16 code. Using the encoding process disclosed above, one skilled in the art could construct the QM2-Parity decoder 92 of FIG. 5; the details are therefore not disclosed since they are not necessary to understand the present invention.

The objects of the invention have been fully realized through the embodiments disclosed herein. Those skilled in the art will appreciate that the various aspects of the invention can be achieved through different embodiments without departing from the essential function. For example, the aspects of the present invention could be applied to attenuate error events in sequence detectors other than EEPR4. An alternative embodiment for constructing the QM2 and parity error detection code would be to first encode the QM2 constraint, and then append a number of bits to generate the parity constraint. Furthermore, those skilled in the art will appreciate that EDC codes other than parity could be employed to detect when the sequence detector has made a detection error. The particular embodiments disclosed are illustrative and not meant to limit the scope of the invention as appropriately construed from the following claims.

What is claimed is:

1. A sampled amplitude read channel for reading data recorded on a disk storage medium by detecting an estimated binary sequence from a sequence of discrete-time sample values generated by sampling an analog read signal emanating from a read head positioned over the disk storage medium, the sampled amplitude read channel comprising:
   (a) a sampling device for sampling the analog read signal to generate the sequence of discrete-time sample values;
   (b) a trellis sequence detector for detecting a preliminary binary sequence from the sequence of discrete-time sample values, the trellis sequence detector comprising a time varying state machine matched to a predetermined code constraint encoded into the data recorded on the disk storage medium; and
   (c) a post processor comprising an error corrector, responsive to the discrete-time sample values, for correcting errors in the preliminary binary sequence.

2. The sampled amplitude read channel as recited in claim 1, wherein the trellis sequence detector does not detect a predetermined sequence of bits.

3. The sampled amplitude read channel as recited in claim 2, wherein signal samples representing the predetermined sequence of bits differ from signal samples representing a corresponding number of bits in the preliminary binary sequence by a predetermined distance in Euclidean space.

4. The sampled amplitude read channel as recited in claim 2, wherein the predetermined sequence of bits comprises more than four consecutive NRZI "1" bits.

5. The sampled amplitude read channel as recited in claim 2, wherein:
 (a) the sequence detector detects an even and odd interleave of the preliminary binary sequence; and
 (b) the predetermined sequence of bits comprises four consecutive NRZI "1" bits in one of the even or odd interleaves.

6. The sampled amplitude read channel as recited in claim 2, wherein the error corrector does not correct the preliminary binary sequence if the correction results in the preliminary binary sequence comprising the predetermined sequence of bits.

7. The sampled amplitude read channel as recited in claim 2, wherein:
 (a) a dipulse response of the channel comprises a plurality of non-zero sample values;
 (b) the discrete-time sample values comprise linear combinations of time-shifted dipulse responses;
 (c) a full trellis state machine defines all possible combinations of time-shifted dipulse responses;
 (d) the code constraint codes out a first minimum distance error event of the full trellis state machine; and
 (e) the error corrector corrects a second minimum distance error event of the full trellis state machine.

8. The sampled amplitude read channel as recited in claim 7, wherein the dipulse response is selected from the group consisting of an EPR4 dipulse response and an EEPR4 dipulse response.

9. The sampled amplitude read channel as recited in claim 2, wherein:
 (a) the post processor further comprises a syndrome generator for generating an error syndrome from the preliminary binary sequence; and
 (b) the error corrector uses the error syndrome to correct the preliminary binary sequence.

10. The sampled amplitude read channel as recited in claim 9, wherein the error syndrome is a parity error syndrome generated over a predetermined number of bits in the preliminary binary sequence.

11. A sampled amplitude read/write channel for writing user data to a disk storage medium and reading the user data from the disk storage medium, comprising:
 (a) an encoder for encoding n bits of user data into an m-bit codeword, the m-bit codeword comprising a first channel code constraint, consecutive NRZI "1" bits, and a second channel code constraint;
 (b) write circuitry for writing the m-bit codeword to the disk storage medium;
 (c) a sampling device for sampling an analog read signal to generate a sequence of discrete-time sample values;
 (d) a trellis sequence detector matched to the first channel code constraint for detecting a preliminary binary sequence from the sequence of discrete-time sample values; and
 (e) a post processor comprising:
  (i) a syndrome generator for generating an error syndrome in response to the preliminary binary sequence and the second channel code constraint; and
  (ii) an error corrector, responsive to the discrete-time sample values and the error syndrome, for correcting errors in the preliminary binary sequence.

12. The sampled amplitude read/write channel as recited in claim 11, wherein a redundancy bit is encoded into the m-bit codeword to generate the second channel code constraint.

13. The sampled amplitude read/write channel as recited in claim 12, wherein the redundancy bit is generated as parity over a predetermined number of bits in NRZ.

14. The sampled amplitude read/write channel as recited in claim 11, wherein the first channel code constraint codes out of the m-bit codeword a predetermined data sequence.

15. The sampled amplitude read/write channel as recited in claim 14, wherein the predetermined data sequence comprises more than four consecutive NRZI "1" bits.

16. The sampled amplitude read/write channel as recited in claim 14, wherein:
 (a) the m-bit codeword comprise an even and odd interleave; and
 (b) the predetermined data sequence comprises four consecutive NRZI "1" bits in one of the even or odd interleaves.

17. The sampled amplitude read/write channel as recited in claim 11, wherein the trellis sequence detector comprises a state machine matched to the first channel code constraint.

18. The sampled amplitude read/write channel as recited in claim 17, wherein the state machine is time varying.

19. The sampled amplitude read/write channel as recited in claim 11, wherein the post processor further comprises:
 (a) a remodulator for remodulating the preliminary binary sequence into a sequence of estimated sample values;
 (b) a sample error generator, responsive to the discrete-time sample values and the estimated sample values, for generating a sample error sequence; and
 (c) an error pattern detector for detecting an error event in the sample error sequence.

20. The sampled amplitude read/write channel as recited in claim 19, wherein the error pattern detector comprises a discrete time filter matched to a minimum distance error event of the trellis sequence detector.

21. A method for writing and reading user data to and from a disk storage medium, comprising the steps of:
 (a) encoding n bits of user data into an m-bit codeword, wherein the m-bit codeword is devoid of a predetermined data sequence and the code rate n/m is greater than 2/3;
 (b) sampling an analog read signal emanating from a read head positioned over the disk storage medium to generate a sequence of discrete-time sample values;
 (c) detecting a preliminary binary sequence from the sequence of discrete-time sample values;
 (d) generating an error syndrome in response to the preliminary binary sequence; and
 (e) correcting errors in the preliminary binary sequence using the discrete-time sample values and the error syndrome.

22. The method for writing and reading user data as recited in claim 21, wherein the predetermined data sequence comprises more than four consecutive NRZI "1" bits.

23. The method for writing and reading user data as recited in claim 21, wherein:
 (a) the m-bit codeword comprise an even and odd interleave; and
 (b) the predetermined data sequence comprises four consecutive NRZI "1" bits in one of the even or odd interleaves.

24. A sampled amplitude read/write channel for writing user data to a disk storage medium and reading the user data from the disk storage medium, comprising:

(a) an encoder for encoding n bits of user data into an m-bit codeword, the m-bit codeword comprising a first channel code constraint for attenuating error events of a first predetermined distance, and a second channel code constraint for attenuating error events of a second predetermined distance, wherein the first predetermined distance does not equal the second predetermined distance;

(b) write circuitry for writing the m-bit codeword to the disk storage medium;

(c) a sampling device for sampling an analog read signal to generate a sequence of discrete-time sample values;

(d) a sequence detector for detecting a binary sequence from the sequence of discrete-time sample values; and (e) a post processor comprising:
  (i) a syndrome generator for generating an error syndrome in response to the binary sequence and the second channel code constraint; and
  (ii) an error corrector, responsive to the discrete-time sample values and the error syndrome, for correcting errors in the binary sequence.

25. The sampled amplitude read/write channel as recited in claim 24, wherein the first predetermined distance is greater than the second predetermined distance.

26. The sampled amplitude read/write channel as recited in claim 24, wherein the encoder simultaneously encoders the first and second channel code constraints into the m-bit codeword.

27. The sampled amplitude read/write channel as recited in claim 24, wherein the sequence detector comprises a state machine matched to the first channel code constraint.

28. The sampled amplitude read/write channel as recited in claim 24, wherein the post processor further comprises:

(a) a remodulator for remodulating the binary sequence into a sequence of estimated sample values;

(b) a sample error generator, responsive to the discrete-time sample values and the estimated sample values, for generating a sample error sequence; and (c) an error pattern detector for detecting an error event in the sample error sequence.

* * * * *